United States Patent
Inoue

(10) Patent No.: US 9,871,227 B2
(45) Date of Patent: Jan. 16, 2018

(54) LIGHT SCATTERING LAYER HAVING PARTICLES FOR AN ORGANIC EL LIGHT EMITTING DEVICE

(71) Applicant: ZEON CORPORATION, Chiyoda-ku, Tokyo (JP)

(72) Inventor: Hiroyasu Inoue, Tokyo (JP)

(73) Assignee: ZEON CORPORATION, Chiyoda-ku, Tokyo (JP)

(*) Notice: Subject to any disclaimer, the term of this patent is extended or adjusted under 35 U.S.C. 154(b) by 0 days.

(21) Appl. No.: 15/327,769

(22) PCT Filed: Jul. 30, 2015

(86) PCT No.: PCT/JP2015/071722
§ 371 (c)(1),
(2) Date: Jan. 20, 2017

(87) PCT Pub. No.: WO2016/017781
PCT Pub. Date: Feb. 4, 2016

(65) Prior Publication Data
US 2017/0200918 A1 Jul. 13, 2017

(30) Foreign Application Priority Data

Jul. 31, 2014 (JP) .................. 2014-156435

(51) Int. Cl.
*H01L 29/08* (2006.01)
*H01L 21/00* (2006.01)
*H01L 51/52* (2006.01)

(52) U.S. Cl.
CPC ...... *H01L 51/5268* (2013.01); *H01L 51/5275* (2013.01)

(58) Field of Classification Search
CPC ............ H01L 51/5268; H01L 51/5275; H01L 51/5271
See application file for complete search history.

(56) References Cited

U.S. PATENT DOCUMENTS 8,704,441 B2 * 4/2014 Fujita .................. H01L 51/5262
 313/110
2006/0049745 A1 3/2006 Handa et al.
(Continued)

FOREIGN PATENT DOCUMENTS

JP 2004296437 A 10/2004
JP 2012142182 A 7/2012
(Continued)

OTHER PUBLICATIONS

Sep. 29, 2015, International Search Report issued in the International Patent Application No. PCT/JP2015/071722.
(Continued)

*Primary Examiner* — Alonzo Chambliss
(74) *Attorney, Agent, or Firm* — Kenja IP Law PC

(57) ABSTRACT

An organic EL light-emitting device including: a light-emitting layer capable of generating light; a light-scattering structure capable of scattering the light; a first light-scattering layer containing first light-scattering particles having an average particle diameter of 0.1 μm to 2 μm and a first binder; and a concavo-convex structure in a streak array pattern, the light emitting layer, the light-scattering structure, the first light-scattering layer, and the concavo-convex structure being disposed in this order, wherein a mean free path L1 of light scattering in the first light-scattering layer and a thickness D1 of the first light-scattering layer satisfy D1/L1<15.

11 Claims, 5 Drawing Sheets

(56) References Cited

U.S. PATENT DOCUMENTS

| | | |
|---|---|---|
| 2009/0066219 A1 | 3/2009 | Handa et al. |
| 2009/0066220 A1 | 3/2009 | Handa et al. |
| 2012/0025185 A1* | 2/2012 | Kasamatsu ......... H01L 51/5012 257/40 |
| 2012/0228591 A1* | 9/2012 | Sawabe ............... H01L 51/5268 257/40 |
| 2013/0076238 A1 | 3/2013 | Fujita et al. |
| 2014/0008676 A1* | 1/2014 | Wang .................. H01L 51/5262 257/98 |
| 2014/0054572 A1 | 2/2014 | Li et al. |

FOREIGN PATENT DOCUMENTS

| | | |
|---|---|---|
| JP | 2012203233 A | 10/2012 |
| JP | 2013258045 A | 12/2013 |
| WO | 2012002260 A1 | 1/2012 |

OTHER PUBLICATIONS

Jan. 31, 2017, International Preliminary Report on Patentability issued in the International Patent Application No. PCT/JP2015/071722.

* cited by examiner

LIGHT SCATTERING LAYER HAVING PARTICLES FOR AN ORGANIC EL LIGHT EMITTING DEVICE

FIELD

The present invention relates to an organic EL light-emitting device. Herein, the "organic EL" is an abbreviation of "organic electroluminescence".

BACKGROUND

An organic EL light-emitting device having a plurality of electrode layers and a light-emitting layer disposed therebetween to generate electrical light has been studied for its use as a display device that can be a substitute for a liquid crystal cell. The organic EL light-emitting device has also been studied as to its use for a surface light source device such as planar lighting and a backlight for a liquid crystal display device, taking advantages of its characteristics such as high light-emitting efficiency, low-voltage drive, lightweight, and low cost.

When the organic EL light-emitting device is used as a light source of a surface light source device, there is a demand for extracting light in a useful state with high efficiency from an element. For example, although the light-emitting layer of the organic EL light-emitting device has high light-emitting efficiency, the layers constituting the device may incur a large amount of loss of light while the light is passing through the layer before the light emission, depending on conditions such as a refractive index difference between the layers. Therefore, there is a demand for keeping the loss of light as small as possible.

As a method for increasing light extraction efficiency, for example, provision of many concave portions or convex portions on a light-emitting surface of the organic EL light-emitting device has been known. For example, Patent Literature 1 proposes that pyramidal concave portions are formed on a light-emitting surface of an organic EL light-emitting device, by which improvement in the light extraction efficiency is expected.

CITATION LIST

Patent Literature

Patent Literature 1: WO2012/002260 A1

SUMMARY

Technical Problem

However, formation of pyramidal concave or convex portions on a light-emitting surface may cause increase of the production cost. Therefore, a technology for enhancing the light extraction efficiency of an organic EL light-emitting device while suppressing increase of production cost is required.

As the technology for enhancing the light extraction efficiency while suppressing the increase of production cost, formation of a concavo-convex structure in a streak array pattern on a light-emitting surface of an organic EL light-emitting device can be considered. The concavo-convex structure in a streak array pattern can be easily produced by smaller number of steps than that of steps of forming pyramidal concave and convex portions. Therefore, the concavo-convex structure in a streak array pattern can be produced usually at a lower cost than that for the formation of the pyramidal concave and convex portions. However, it is difficult to enhance the light extraction efficiency of an organic EL light-emitting device having the concavo-convex structure in a streak array pattern on a light-emitting surface to the same level as the light extraction efficiency of an organic EL light-emitting device having the pyramidal concave or convex portions on a light-emitting surface.

The present invention has been made in view of the aforementioned problems, and an object of the present invention is to provide an organic EL light-emitting device having a concavo-convex structure in a streak array pattern and having excellent light extraction efficiency.

Solution to Problem

The present inventor has intensively studied to solve the aforementioned problems. As a result, the inventor has found that the light extraction efficiency of an organic EL light-emitting device including a light-emitting layer, a light-scattering structure and a concavo-convex structure in a streak array pattern in this order can be enhanced when a light-scattering layer containing light-scattering particles and a binder is provided between the light-scattering structure and the concavo-convex structure so as to satisfy predetermined requirements, thereby completing the present invention.

Specifically, the present invention is as follows.

(1) An organic EL light-emitting device comprising: a light-emitting layer capable of generating light; a light-scattering structure capable of scattering the light; a first light-scattering layer containing first light-scattering particles having an average particle diameter of 0.1 μm to 2 μm and a first binder; and a concavo-convex structure in a streak array pattern, the light emitting layer, the light-scattering structure, the first light-scattering layer, and the concavo-convex structure being disposed in this order, wherein
a mean free path $L1$ of light scattering in the first light-scattering layer and a thickness $D1$ of the first light-scattering layer satisfy $D1/L1<15$.

(2) The organic Em light-emitting device according to (1), wherein
the average particle diameter of the first light-scattering particles is 0.4 μm to 1 μm, and $$D1/L1<6.$$

(3) The organic EL light-emitting device according to (1) or (2), wherein
the light-scattering structure is a second light-scattering layer containing second light-scattering particles, and
a mean free path $L2$ of light scattering in the second light-scattering layer and a thickness $D2$ of the second light-scattering layer satisfy $(D1/L1+D2/L2)<6$.

(4) The organic EL light-emitting device according to (3), wherein a ratio of the second light-scattering particles in the second light-scattering layer is 0.5% by weight or more and 40% by weight or less.

(5) The organic EL light-emitting device according to (3) or (4), wherein an average particle diameter of the second light-scattering particles is 0.2 μm or more and 2 μm or less.

(6) The organic EL light-emitting device according to any one of (1) to (5), wherein the concavo-convex structure includes a prism.

(7) The organic EL light-emitting device according to (6), wherein the prism has an apex angle of 80° or smaller.

(8) The organic EL light-emitting device according to any one of (1) to (7), wherein the first binder has a refractive index of 1.5 or more.

(9) The organic EL light-emitting device according to any one of (1) to (8), wherein the first binder contains high refractive index nanoparticles.

(10) The organic EL light-emitting device according to (9), wherein the high refractive index nanoparticles are contained in a ratio of 20% by weight or more and 80% by weight or less relative to a total amount of the first binder.

(11) The organic EL light-emitting device according to any one of (1) to (10), wherein the first light-scattering layer has adhesiveness.

Advantageous Effects of Invention

The present invention can provide an organic EL light-emitting device that has a concavo-convex structure in a streak array pattern and is excellent in light extraction efficiency.

DESCRIPTION OF EMBODIMENTS

Although the present invention will be described below in detail by way of embodiments and examples, the present invention is not limited to the embodiments, the examples, and the like described below and may be freely modified for implementation without departing from the scope of the claims of the present invention and equivalents thereto.

1. First Embodiment

Figure 1:
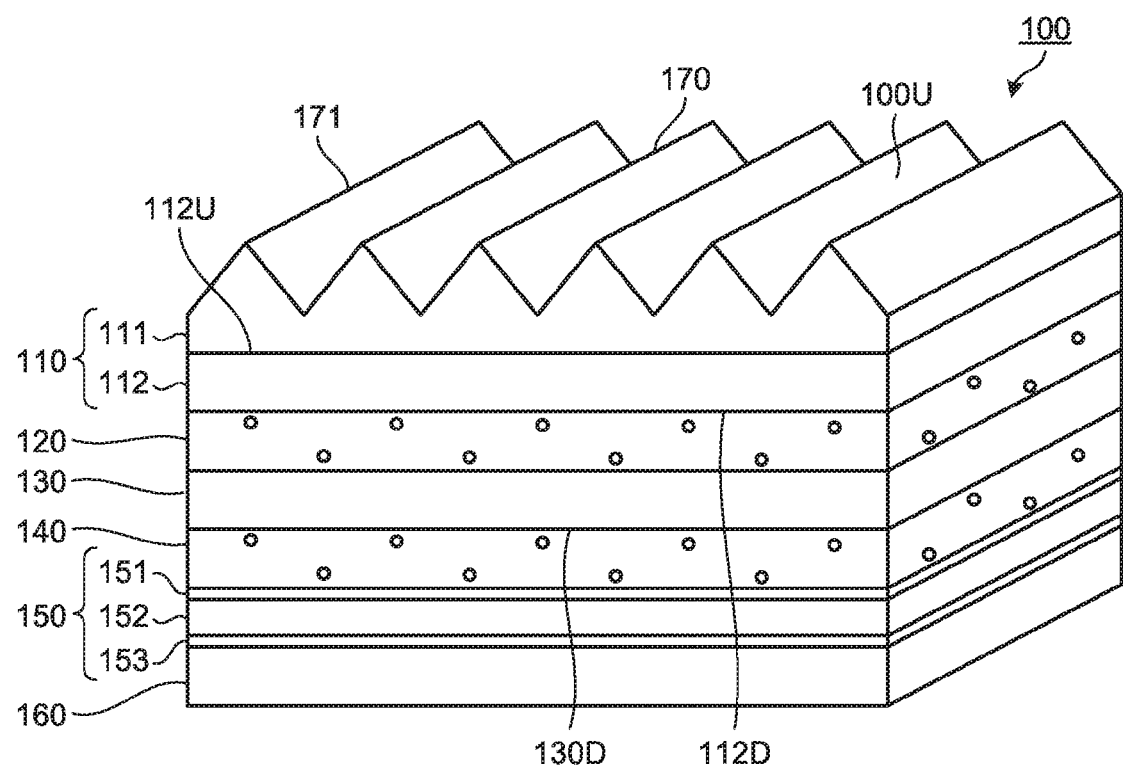
FIG. 1 is a perspective view schematically showing an organic EL light-emitting device according to a first embodiment of the present invention.

FIG. 1 is a perspective view schematically showing an organic EL light-emitting device 100 according to a first embodiment of the present invention.

As shown in FIG. 1, the organic EL light-emitting device 100 according to the first embodiment of the present invention is a device for emitting light generated within the organic EL light-emitting device 100 through a light-emitting surface 100U. This organic EL light-emitting device 100 includes a light-emitting surface structure layer 110, a first light-scattering layer 120, a substrate plate layer 130 as a supporting substrate plate, a second light-scattering layer 140 as a light-scattering structure, a light-emitting element layer 150, and a sealing layer 160 in this order from a side close to the light-emitting surface 100U. The light-emitting surface structure layer 110 has a concavo-convex structure layer 111 having a concavo-convex structure 170 in a streak array pattern, and a substrate film layer 112. Herein the "concavo-convex structure in a streak array pattern" represents a group of a plurality of concave portions or convex portions that are provided side by side, wherein each portion continuously extends over a certain length. The light-emitting element layer 150 includes a transparent electrode layer 151 as a first electrode layer, a reflecting electrode layer 153 as a second electrode layer, and a light-emitting layer 152 provided between the transparent electrode layer 151 and the reflecting electrode layer 153.

The organic EL light-emitting device 100 includes the sealing layer 160, the reflecting electrode layer 153, the light-emitting layer 152, the transparent electrode layer 151, the second light-scattering layer 140, the substrate plate layer 130, the first light-scattering layer 120, the substrate film layer 112, and the concavo-convex structure layer 111 in this order in the thickness direction of the organic EL light-emitting device 100. Therefore, light generated in the light-emitting layer 152 passes through the transparent electrode layer 151, or is reflected by the reflecting electrode layer 153 and then passes through the light-emitting layer 152 and the transparent electrode layer 151. Subsequently, the light passes through the second light-scattering layer 140, the substrate plate layer 130, the first light-scattering layer 120, the substrate film layer 112, and the concavo-convex structure layer 111, and exits through the light-emitting surface 100U.

[1.1. Light-Emitting Surface Structure Layer 110]

The light-emitting surface structure layer 110 includes the concavo-convex structure layer 111 and the substrate film layer 112. A surface of the light-emitting surface structure layer 110 on a side opposite to the light-emitting element layer 150 is a surface of the concavo-convex structure layer 111 on a side opposite to the substrate film layer 112, and is exposed at the outermost surface of the organic EL light-emitting device 100. The surface of the concavo-convex structure layer 111 on the side opposite to the substrate film layer 112 is thus the light-emitting surface 100U of the organic EL light-emitting device 100, that is, the light-emitting surface 100U through which light exits from the organic EL light-emitting device 100 to the outside of the device.

The concavo-convex structure layer 111 has the concavo-convex structure 170 in a streak array pattern on the light-emitting surface 100U. Therefore, the light-emitting surface 100U is not a flat surface from a macroscopic viewpoint. However, since the concave portions and the convex portions included in the concavo-convex structure 170 are small, the light-emitting surface 100U may be a flat surface parallel to a principal plane of the organic EL light-emitting device 100 when viewing the light-emitting surface 100U macroscopically. Therefore, being parallel or perpendicular to the light-emitting surface 100U in the following description means being parallel or perpendicular to the light-emitting surface 100U from a macroscopic viewpoint without taking concave or convex portions into consideration, unless otherwise specified. In this embodiment, unless otherwise specified, the organic EL light-emitting device 100 is described in a state where the light-emitting surface 100U is disposed in parallel to the horizontal direction and faces upward. Further, "parallel" or "perpendicular" relationship of constituent members may include instances having an error within a rage that does not impair the effects of the present invention, for example, within a range of ±5°.

The concavo-convex structure 170 in a streak array pattern formed on the light-emitting surface 100U includes a plurality of concave portions and convex portions each of which extends in a direction parallel to the light-emitting surface 100U. All of the concave portions or the convex portions usually extend in the same direction. Though the concave portions or the convex portions may be formed at intervals as long as the effects of the present invention are not remarkably impaired, the concave portions or the convex portions are usually formed side by side with no spacing therebetween. The shape of the concave portions or the convex portions may be freely determined. For example, a cross-sectional shape obtained by cutting the concave portions or the convex portions on a plane perpendicular to the extending direction of the concave portions or the convex portions may be polygonal, and may also be a part of a circle or an ellipse. Specifically, when the aforementioned cross-sectional shape is a triangle, the concave portion or the convex portion forms a prism. When the aforementioned cross-sectional shape is a part of a circle or an ellipse, the concave portion or the convex portion forms a lenticular lens.

In this embodiment, an example where the concavo-convex structure 170 consists of a group of prisms 171 as a plurality of convex portions extending in one direction will be described. The cross-sectional shape of each of the prisms 171 obtained by cutting the prisms 171 on a plane perpendicular to the direction in which the prisms 171 extend is an isosceles triangle. The prisms 171 are disposed in parallel to each other with no spacing therebetween on the entire light-emitting surface 100U.

Figure 2:
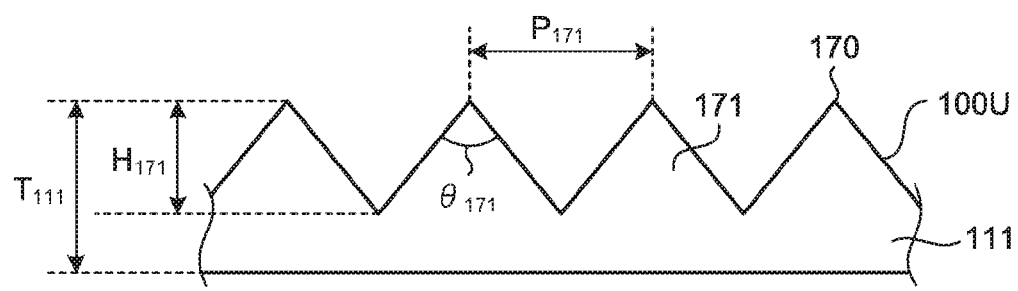
FIG. 2 is a cross-sectional view schematically showing a cross section of a concavo-convex structure layer of the organic EL light-emitting device according to the first embodiment of the present invention.

FIG. 2 is a cross sectional view schematically showing a cross section of the concavo-convex structure layer 111 of the organic EL light-emitting device 100 according to the first embodiment of the present invention.

As shown in FIG. 2, the apex angle $\theta_{171}$ of the prisms 171 contained in the convex-concave structure 170 is preferably 10° or larger, more preferably 20° or larger, and particularly preferably 30° or larger, and is preferably 80° or smaller, more preferably 70° or smaller, and particularly preferably 65° or smaller. When the apex angle $\theta_{171}$ of the prisms 171 is equal to or larger than the lower limit of the above-described range, damage to the prisms 171 can be suppressed. When it is equal to or smaller than the upper limit, the light extraction efficiency of the organic EL light-emitting device 100 can be enhanced.

The size of the prisms 171 may be optionally set as long as the effects of the present invention are not remarkably impaired. For example, the pitch $P_{171}$ between the prisms 171 is usually 1 μm or more, preferably 5 μm or more, and more preferably 10 μm or more, and is usually 500 μm or less, preferably 100 μm or less, and more preferably 50 μm or less. The height (or depth) $H_{171}$ of the prisms 171 is usually 1 μm or more, preferably 5 μm or more, and more preferably 10 μm or more, and is usually 500 μm or less, preferably 100 μm or less, and more preferably 50 μm or less. When the size of the prisms 171 falls within the range, the light extraction efficiency of the organic EL light-emitting device 100 can be enhanced.

As an example of a material for the concavo-convex structure layer 111, a transparent material is usually used. Herein, a material being "transparent" means that the material has a light transmittance that suitable to be used for an optical member. For example, the total light transmittance of the material in terms of a thickness of 1 mm is usually 80% or more, and preferably 90% or more. The total light transmittance can be measured in accordance with JIS K7361-1997.

Specific examples of the transparent material may include a variety of types of resins. Examples of the resins may include a thermoplastic resin; a thermosetting resin; and an energy ray curable resin such as an ultraviolet curable resin and an electron beam curable resin. Among these, a thermoplastic resin is preferred since it is easily deformed by heat. An ultraviolet curable resin is preferred since it has high curability and favorable efficiency to allow efficient formation of the concavo-convex structure layer 111. Examples of the thermoplastic resin may include a polyester resin, a polyacrylate resin, and a cycloolefin resin. Examples of the ultraviolet curable resin may include an epoxy resin, an acrylic resin, a urethane resin, an ene/thiol resin, and an isocyanate resin. It is preferable that these resins contain a polymer having a plurality of polymerizable functional groups. One type thereof may be used alone, or two or more types thereof may be used in combination at any ratio.

It is preferable that the material for the concavo-convex structure layer 111 is a material capable of having a high hardness by curing since therewith the concavo-convex structure 170 can be easily formed and scratch resistance can be easily imparted to the concavo-convex structure 170. Specifically, it is preferable that the material has a pencil hardness of equal to or more than HB, further preferably equal to or more than H, and more preferably equal to or more than 2H. The pencil hardness is measured for a layer having a film thickness of 7 μm and no concavo-convex structure.

The thickness $T_{111}$ of the concavo-convex structure layer 111 is preferably 1 μm or more, and more preferably 5 μm or more, and may be 10 μm or more. The thickness $T_{111}$ of the concavo-convex structure layer 111 is preferably 500 μm or less, and more preferably 100 μm or less, and may be 50 μm or less. When the thickness $T_{111}$ of the concavo-convex structure layer 111 is equal to or less than the upper limit of the above-described range, deformation like curling of the concavo-convex structure layer 111 caused by curing shrinkage can be prevented and the concavo-convex structure layer 111 of a favorable shape can be achieved.

The substrate film layer 112 shown in FIG. 1 is a optional layer, and usually includes a film formed of a transparent material. The substrate film layer 112 may be formed of the same material as that for the concavo-convex structure layer 111. However, when the substrate film layer 112 is formed of a material different from that for the concavo-convex structure layer 111, the light-emitting surface structure layer 110 having a variety of characteristics can be obtained. For example, it is preferable that the concavo-convex structure layer 111 is formed or a material having a high hardness and the substrate film layer 112 is formed of a flexible material. By combination of the materials as described above, the handleability of the substrate film layer 112 during formation of the concavo-convex structure layer 111 can be improved. The handleability of the light-emitting surface structure layer 110 after the formation of the concavo-convex structure layer 111 can also be enhanced. Further, the durability of the light-emitting surface structure layer 110 can also be enhanced. Consequently, the organic EL light-emitting device 100 having high performance can be easily produced.

Examples of the material for the substrate film layer 112 may include an alicyclic olefin polymer and a polyester. One type thereof may be used alone, or two or more types thereof may be used in combination at any ratio.

The refractive index of the substrate film layer 112 is preferably close to the refractive index of a binder of the first light-scattering layer 120. Hereinafter, the binder of the first light-scattering layer 120 may be appropriately referred to as "first, binder". Specifically, a difference between the refractive index of the substrate film layer 112 and the refractive index of the first binder is preferably 0.15 or less, more preferably 0.1 or less, and further preferably 0.03 or less. In this manner, the light extraction efficiency of the organic EL light-emitting device 100 can be enhanced. Herein, one refractive index may be measured by an ellipsometer (for example, "M-2000" manufactured by J. A. Woollam Japan).

The thickness of the substrate film layer 112 is preferably 20 μm to 300 μm.

The method for producing the aforementioned light-emitting surface structure layer 110 is not limited. For example, the light-emitting surface structure layer 110 may be produced by forming the concavo-convex structure layer 111 on a surface 112U of the substrate film layer 112 by a photopolymer method (2P method) using the aforementioned material for the concavo-convex structure layer 111.

[1.2. First Light-Scattering Layer 120]
(1.2.1. Requirements Satisfied by First Light-Scattering Layer 120)

As shown in FIG. 1, the first light-scattering layer 120 is a layer provided between the concavo-convex structure layer 111 and the second light-scattering layer 140, and includes first light-scattering particles and the first binder. The first light-scattering layer 120 satisfies the following requirements (R) and (B).

Requirement (A): The average particle diameter of the first light-scattering particles is 0.1 μm to 2 μm.

Requirement (B): The mean free path L1 of light scattering in the first light-scattering layer 120 and the thickness D1 of the first light-scattering layer 120 satisfy D1/L1<15.

When the organic EL light-emitting device 100 includes the first light-scattering layer 120 that satisfies the requirements (A) and (B) described above in combination with the second light-scattering layer 140 as the light-scattering structure, high light extraction efficiency can be achieved even if the concavo-convex structure in a streak array pattern is employed as the concavo-convex structure 170 formed on the concavo-convex structure layer 111.

Hereinafter, these requirements will be described in detail.

The requirement (A) will be first described.

The average particle diameter of the first light-scattering particles is usually 0.1 μm or more, preferably 0.4 μm or more, and more preferably 0.5 μm with or more, and is usually 2 μm or less, preferably 1 μm or less, and more preferably 0.9 μm or less. Unless otherwise specified, the average particle diameter herein refers to a volume average particle diameter. The volume average particle diameter represents a particle diameter at which a cumulative volume calculated from a small-diameter side in a particle diameter distribution measured by a laser diffraction method reaches 50%. When the average particle diameter of the first light-scattering particles is equal to or more than the lower limit of the above-described range, the particle diameter of the first light-scattering particles can be stably made longer than the wavelength of light to be scattered. Therefore, visible light can be stably scattered by the first light-scattering particles. When the average particle diameter is equal to or less than the upper limit, the particle diameter can be decreased. Therefore, light that reaches the first light-scattering particles can be reflected to a wide region. Accordingly, visible light can be efficiently scattered by the first light-scattering particles.

The requirement (B) will now be described.

In the first light-scattering layer 120, D1/L1 is usually less than 15, preferably less than 6, and more preferably less than 4.5. When D1/L1 falls within such a range, the light extraction efficiency of the organic EL light-emitting device 100 can be effectively enhanced. Herein, "D1" represents the thickness of the first light-scattering layer 120. "L1" represents the mean free path of light scattering in the first light-scattering layer 120. The lower limit of D1/L1 is not particularly limited, and is usually more than 0, preferably more than 0.5, and more preferably more than 1.0. In this manner, the light extraction efficiency can be enhanced similarly to the case of the upper limit.

In general, the mean free path L of light scattering in a light-scattering layer containing a binder and light-scattering particles dispersed in the binder is calculated by "mean free path L=1/(number density of light-scattering particles×scattering cross section)".

The number density of the light-scattering particles is the number of the light-scattering particles per unit volume. In calculation of number density of the light-scattering particles, the volume per particle of the light-scattering particles is usually used. When the volume per particle of the light-scattering particles is calculated, the particle diameter of the light-scattering particles may be used. Since the particle diameter of the light-scattering particles is usually distributed in a certain range, the volume average particle diameter of the light-scattering particles may be used as a representative value for the particle diameter used in calculation of number density of the light-scattering particles. In order to simplify the calculation of volume per particle of the light-scattering particles, the shape of the light-scattering particles is assumed to be a sphere for calculation.

The scattering cross section may be obtained by Mie scattering theory (MIE THEORY). The Mie scattering theory is that the solution of Maxwell's electromagnetic equations is determined in a case where a medium (matrix) having a uniform refractive index contains spherical particles having a refractive index different from that of the medium. The spherical particles correspond to the light-scattering particles, and the medium corresponds to the binder. In accordance with this theory, the aforementioned scattering cross section is calculated by "scattering cross section=scattering efficiency $K(\alpha)$×actual cross-section area of spherical particles $\pi r^2$".

Herein, the intensity distribution $I(\alpha, \theta)$ that depends on the angle of scattering light is represented by the following equation (1). The scattering efficiency $K(\alpha)$ is represented by the following equation (2). Further, $\alpha$ is represented by the following equation (3). It is an amount corresponding to the radius r of the spherical particles normalized by the wavelength $\lambda$ of light in the medium. The angle $\theta$ is a scattering angle. The angle $\theta$ in the traveling direction of incident light is 180°. $i_1$ and $i_2$ the equation (1) are represented by the equation (4). a and b with subscript ν in the equations (2) to (4) are represented by the equation (5). P (cos θ) with superscript 1 and subscript ν consists of Legendre's polynomials. a and b with subscript ν consist of Recatti-Bessel functions $\Psi_v$ and $\zeta_v$ that are linear and quadratic (provided that $_v$ means subscript v) and derived functions thereof. m is a relative refractive index of the spherical particles on the basis of the matrix, and $m=n_{scatter}/n_{matrix}$. $n_{scatter}$ represents the refractive index of the spherical particles. $n_{matrix}$ represents the refractive index of the medium.

$$I(\alpha, \theta) = \frac{\lambda^2}{8\pi^2}(i_1 + i_2) \quad (1)$$

$$K(\alpha) = \left(\frac{2}{\alpha^2}\right)\sum_{v=1}^{\infty}(2v+1)(|a_v|^2 + |b_v^2|) \quad (2)$$

$$\alpha = 2\pi r/\lambda \quad (3)$$

$$i_1 = \left|\sum_{v=1}^{\infty}\frac{2v+1}{v(v+1)}\left\{a_v\frac{P_v^1(\cos\theta)}{\sin\theta} + b_v\frac{dP_v^1(\cos\theta)}{d\theta}\right\}\right|^2 \quad (4)$$

$$i_2 = \left|\sum_{v=1}^{\infty}\frac{2v+1}{v(v+1)}\left\{b_v\frac{P_v^1(\cos\theta)}{\sin\theta} + a_v\frac{dP_v^1(\cos\theta)}{d\theta}\right\}\right|^2$$

$$a_v = \frac{\Psi_v'(m\alpha)\Psi_v(\alpha) - m\Psi_v(m\alpha)\Psi_v'(\alpha)}{\Psi_v'(m\alpha)\zeta_v(\alpha) - m\Psi_v(m\alpha)\zeta_v'(\alpha)} \quad (5)$$

$$b_v = \frac{m\Psi_v'(m\alpha)\Psi_v(\alpha) - \Psi_v(m\alpha)\Psi_v'(\alpha)}{m\Psi_v'(m\alpha)\zeta_v(\alpha) - \Psi_v(m\alpha)\zeta_v'(\alpha)}$$

Figure 3:
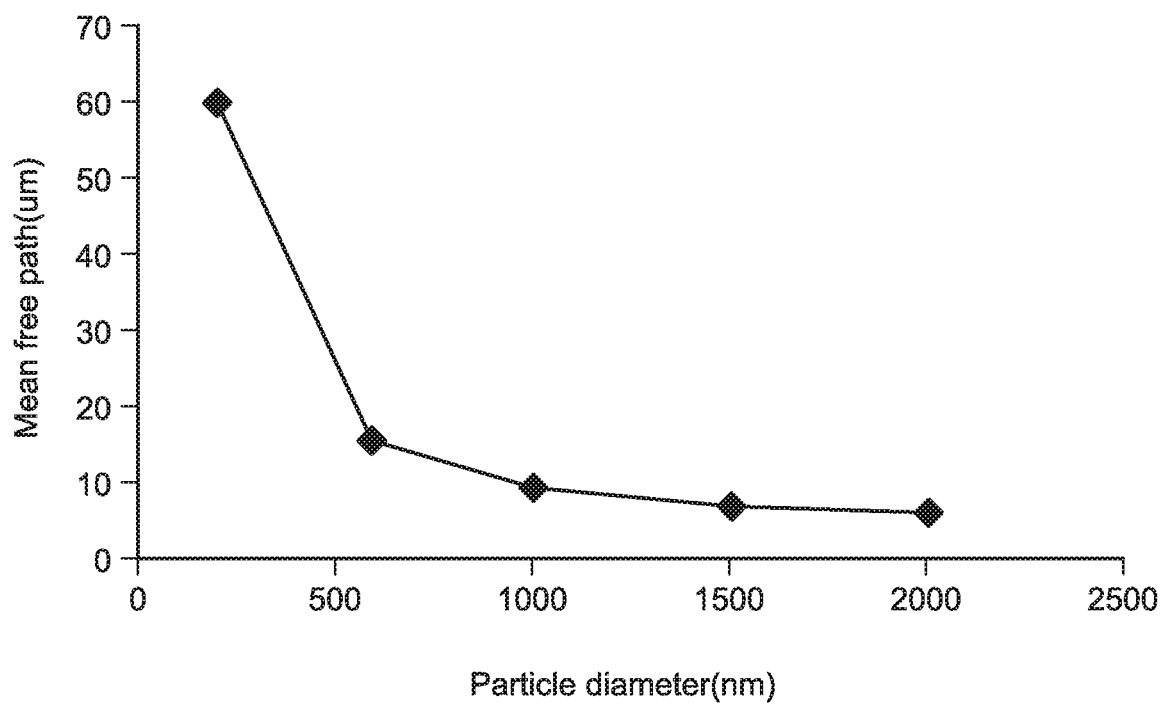
FIG. 3 is a graph showing a relationship between the mean free path of a light-scattering layer according to an example and the particle diameter of light scattering particles contained in the light-scattering layer.

For example, the mean free path L of the light-scattering layer containing a binder having a refractive index of 1.56 and about 10.6% by weight (8% by volume) of silicone particles as light-scattering particles having a refractive index of 1.43 is calculated by the aforementioned method using light that has a wavelength of 550 nm in a vacuum, whereby the result as shown in FIG. 3 is obtained. The example in FIG. 3 shows the mean free path L for a case where the particle diameter of the light-scattering particles is changed to 200 nm, 600 nm, 1,000 nm, 1,500 nm, and 2,000 nm while the volume concentration of the light-scattering particles in the light-scattering layer is constant. In calculation of number density [particles/mm³] of the light-scattering particles, the specific gravity of the binder is assumed to be 1 g/cm³, and the specific gravity of the light-scattering particles is assumed to be 1.32 g/cm³. The shape of the light-scattering particles is assumed to be a sphere. The assumption that the shape of the light-scattering particles is a sphere can be applied to cases where the shape of actual light-scattering particles is close to a sphere. Further, even in cases where the shape of actual light-scattering particles is not close to a sphere, the mean free path L tends to change depending on the particle diameter size of the light-scattering particles, and thus similar tendencies are expected.

(1.2.2. First Light-Scattering Particles)

Any light-scattering particles may be used as the first light-scattering particles as long as the aforementioned requirements and (B) are satisfied. The light-scattering particles are particles capable of scattering light. With the first light-scattering particles, light passing through the first light-scattering layer 120 is scattered, whereby the light extraction efficiency of the organic EL light-emitting device 100 can be enhanced.

For the first light-scattering particles, an inorganic material or an organic material may be used.

Examples of the inorganic material for the first light-scattering particles may include metals and metal compounds. Examples of the metal compounds may include oxides and nitrides of metals. Specific examples thereof may include metal such as silver and aluminum; and metal compounds such as silicon oxide, aluminum oxide, zirconium oxide, silicon nitride, tin-doped indium oxide, and titanium oxide.

Examples of the organic material for the first light-scattering particles may include resins such as a silicone resin, an acrylic resin, and a polystyrene resin.

One type of the material for the first light-scattering particles may be used alone, or two or more types thereof may be used in combination at any ratio.

Of these, the first light-scattering particles formed of the organic material are preferred as the first light-scattering particles. The first light-scattering layer 120 is usually produced using a coating liquid suitable for production of the first light-scattering layer 120. The first light-scattering particles are likely to settle in the coating liquid. In particular, first light-scattering particles containing inorganic particles having high specific gravity are likely to settle. In contrast, first light-scattering particles formed of the organic material are unlikely to settle. Therefore, by using the first light-scattering particles formed of the organic material, the first light-scattering layer 120 that contains the first light-scattering particles homogeneously and evenly can be obtained. Such a first light-scattering layer 120 containing the first light-scattering particles homogeneously is preferred since it can stably exhibit characteristics such as adhesiveness.

Suitable examples of the first light-scattering particles formed of the organic material will be exemplified with trade names. Examples of particles formed of a silicone resin may include a product with a trade name of "XC-99" (available from Momentive Performance Materials Inc., volume average particle diameter: 0.7 µm). Examples of particles formed of an acrylic resin may include a product with a trade name of "MP series" (available from Soken Chemical & Engineering Co., Ltd., volume average particle diameter: 0.8 µm). Examples of particles formed of a polystyrene resin may include a product with a trade name of "SX series" (available from Soken Chemical & Engineering Co., Ltd., volume average particle diameter: 3.5 µm).

One type of the first light-scattering particles may be used alone, or two or more types thereof may be used in combination at any ratio.

The refractive index of the first light-scattering particles is usually 1.2 or more, preferably 1.3 or more, and more preferably 1.4 or more, and is usually 1.55 or less, preferably 1.5 or less, and more preferably 1.45 or less. When the refractive index of the first light-scattering particles is equal to or more than the lower limit of the above-described range, variation of scattering property due to fluctuation of the particle diameter and the film thickness can be suppressed. When the refractive index is equal to or less than the upper limit, light can be sufficiently scattered.

The ratio of the first light-scattering particles in the first light-scattering layer 120 is preferably 0.5% by weight or more, and more preferably 3% by weight or more, and is preferably 40% by weight or less, and more preferably 20% by weight or less. When the ratio of the first light-scattering particles falls within the above-described range, the light extraction efficiency of the organic EL light-emitting device 100 can be effectively enhanced. Further, a desired light-scattering effect can be usually obtained to suppress color unevenness depending on a polar angle direction on the light-emitting surface 100U.

(1.2.3. First Binder)

Any material may be used as the first binder as long as the aforementioned requirements (A) and (B) are satisfied. The first binder has a function of holding the first light-scattering particles in the first light scattering lager 120. The first light-scattering particles of the first light-scattering layer 120 are dispersed in the first binder. The first binder is usually transparent. Light passing through the transparent first binder may be reflected on the interface between the first binder and the first light-scattering particles so as to be scattered.

As the first binder, those having adhesiveness are preferably used. Thereby adhesiveness can be imparted to the first light-scattering layer 120. When the first light-scattering layer 120 has adhesiveness, the light-emitting surface structure layer 110 and the substrate plate layer 130 can be easily bonded through the first light-scattering layer 120. Consequently, the organic EL light-emitting device 100 can be easily produced.

As the first binder having such adhesiveness, a resin is usually used. Examples of the resins may include an adhesive containing a polymer as an adhesive material having adhesiveness. Herein the "adhesive" includes not only an adhesive in the narrow sense but also a hot-melt adhesive. Herein, the adhesive in the narrow sense is an adhesive that has a shear storage elastic modulus at 23° C. of less than 1 MPa and shows adhesiveness at normal temperature. Herein, the hot-melt adhesive is an adhesive that has a shear storage elastic modulus at 23° C. of 1 MPa to 500 MPa and does not show adhesiveness at normal temperature. It is particularly preferable that the adhesive for use is an adhesive in the narrow sense showing adhesiveness at normal temperature. Such an adhesive in the narrow sense is a pressure-sensitive adhesive with which adhesion can be effected by application of pressure. The adhesive allows bonding in a simple manner without giving any influences caused by heating, such as deterioration, to the light-emitting layer 152.

Examples of the adhesives may include a rubber-based adhesive, an acrylic adhesive, a silicone-based adhesive, a urethane-based adhesive, a vinyl alkyl ether-based adhesive, a polyvinyl alcohol-based adhesive, a polyvinyl pyrrolidone-based adhesive, a polyacrylamide-based adhesive, and a cellulose-based adhesive. One type thereof may be used alone, or two or more types thereof may be used in combination at any ratio. In particular, an acrylic adhesive is preferred since the adhesive is excellent in characteristics such as transparency, weather resistance, and heat resistance.

The acrylic adhesive usually contains an acrylic polymer as an adhesive material. The acrylic polymer is a polymer containing a structure unit having a structure formed by polymerization of an acrylic monomer. Examples of the acrylic polymer may include a polymer obtained by polymerization of an acrylic monomer; and a polymer obtained by polymerization of a mixture (monomer mixture) of an acrylic monomer with a monomer copolymerizable with the acrylic monomer.

Examples of the acrylic monomer may include alkyl (meth)acrylate. Herein, (meth)acrylate includes acrylate, methacrylate, and a combination thereof. The average number or carbon atoms or alkyl group of alkyl (meth)acrylate is preferably 1 or more, and more preferably 3 or more, and is preferably 12 or less, and more preferably 8 or less. Specific examples of alkyl (meth)acrylate may include methyl (meth)acrylate, ethyl (meth)acrylate, butyl (meth)acrylate, 2-ethylhexyl (meth)acrylate, and isooctyl (meth)acrylate. One type thereof may be used alone, or two or more types thereof may be used in combination at any ratio.

Preferable examples of the monomer copolymerizable with the acrylic monomer may include a monomer having a functional group, a nitrogen atom-containing monomer, and a modifying monomer.

Examples of the monomer having a functional group may include a monomer having a carboxyl group, a monomer having a hydroxyl group, and a monomer having an epoxy group. Examples of the monomer having a carboxyl group may include acrylic acid, methacrylic acid, fumaric acid, maleic acid, and itaconic acid. Examples of the monomer having a hydroxyl group may include 2-hydroxyethyl (meth)acrylate, hydroxybutyl (meth)acrylate, hydroxyhexyl (meth)acrylate, and N-methylol (meth)acrylamide. Examples of the monomer having an epoxy group may include glycidyl (meth)acrylate. When the acrylic monomer and the monomer having a functional group are used in combination, it is preferable that the ratio of the acrylic monomer is 60% by weight to 99.8% by weight and the ratio of the monomer having a functional group is 40% by weight to 0.2% by weight relative to 100% by weight of the sum of the acrylic monomer and the monomer having a functional group.

Examples of the nitrogen atom-containing monomer may include (meth)acrylamide, N,N-dimethyl(meth)acrylamide, N,N-diethyl(meth)acrylamide, (meth)acryloylmorpholine, (meth)acetonitrile, vinyl pyrrolidone, N-cyclohexylmaleimide, itaconimide, and N,N-dimethylaminoethyl(meth)acrylamide. When the acrylic monomer and the nitrogen atom-containing monomer are used in combination, it is preferable that the ratio of the acrylic monomer is 60% by weight to 99.8% by weight and the ratio of the nitrogen atom-containing monomer is 40% by weight to 0.2% by weight relative to 100% by weight of the sum of the acrylic monomer and the nitrogen atom-containing monomer.

Examples of the modifying monomer may include vinyl acetate and styrene. When the acrylic monomer and the modifying monomer are used in combination, it is preferable that the ratio of the acrylic monomer is 60% by weight to 99.8% by weight and the ratio of the modifying monomer is 40% by weight to 0.2% by weight relative to 100% by weight of the sum of the acrylic monomer and the modifying monomer.

One type of the monomer copolymerizable with the acrylic monomer may be used alone, or two or more types thereof may be used in combination at any ratio.

The amount of the polymer as the adhesive material relative to the total amount of the first binder is preferably 10% by weight or more, and more preferably 20% by weight or more, and is preferably 80% by weight or less, and more preferably 70% by weight or less.

The first binder monomer may contain high refractive index nanoparticles. When the high refractive index nanoparticles are used, the refractive index of the first binder can be easily adjusted. For example, by adding the high refractive index nanoparticles to an adhesive having a low refractive index, the refractive index of the adhesive can be increased. As the high refractive index nanoparticles, particles that have a small average particle diameter and higher refractive index than that of the adhesive not containing high refractive index nanoparticles are usually used. Specifically, particles that have a volume average particle diameter of less than 100 nm and a refractive index of 1.6 or more may be used.

Examples of the high refractive index nanoparticles may include particles formed of an inorganic material and particles formed of an organic material having a refractive index of 1.6 or more. Examples of the inorganic material may include oxides such as zirconia, titania, tin oxide, and zinc oxide; titanates such as barium titanate and strontium titanate; and sulfides, selenides, and tellurides such as CdS, CdSe, CdTe, ZnS, HgS, HgSe, PdS, and SbSe. Examples of the organic material having a refractive index of 1.6 or more may include a polystyrene resin. One type thereof may be used alone, or two or more types thereof may be used in combination at any ratio. The surface of the high refractive index nanoparticles may be modified kith a variety of types of functional group for increasing dispersibility, a silane coupling agent, or the like.

Among these, it is preferable that the high refractive index nanoparticles are reactive modified metal oxide particles. The reactive modified metal oxide particles are particles containing a metal oxide and an organic substance that modifies the surface of the metal oxide and has a reactive functional group. Specifically, the reactive modified metal oxide particles are coated particles containing particles of metal oxide and an organic substance that modifies the surface of the particles and that has a reactive functional group.

The reactive functional group in the organic substance having a reactive functional group may be in a state in which the reactive functional group has an interaction with the particles of metal oxide, such as a hydrogen bond. Alternatively, the reactive functional group may not be in such a state but in a state in which the reactive functional group can interact with another substance.

Examples of the reactive functional group may include a hydroxyl group, a phosphoric acid group, a carboxyl group, an amino group, an alkoxy group, an isocyanate group, an acid halide, an acid anhydride, a glycidyl group, a chlorosilane group, and an alkoxysilane group. One type thereof may be used alone, or two or more types thereof may be used in combination at any ratio.

It is particularly preferable that the organic substance having a reactive functional group is an organic substance having an isocyanate group since the stability of the metal oxide and a surrounding substance may be improved. Examples of the organic substance having an isocyanate group may include acryloxymethyl isocyanate, methacryloxymethyl isocyanate, acryloxyethyl isocyanate, methacryloxyethyl isocyanate, acryloxypropyl isocyanate, methacryloxypropyl isocyanate, and 1,1-bis(acryloxymethyl)ethyl isocyanate. One type thereof may be used alone, or two or more types thereof may be used in combination at any ratio.

Examples of the metal oxide contained in the reactive modified metal oxide particles may include titanium oxide, zinc oxide, zirconium oxide, antimony oxide, tin-doped indium oxide (ITO), antimony-doped tin oxide (ATO), fluorine-doped tin oxide (FTO), phosphorus-doped tin oxide (PTO), zinc antimonate (AZO), indium-doped zinc oxide (IZO), aluminum-doped zinc oxide, gallium-doped zinc oxide, cerium oxide, aluminum oxide, and tin oxide. One type thereof may be used alone, or two or more types thereof may be used in combination at any ratio.

The ratio of the organic substance having a reactive functional group in the reactive modified metal oxide particles may be 1 part by weight to 40 parts by weight relative to 100 parts by weight of metal oxide.

The reactive modified metal oxide particles may be obtained as a suspension in which the particles are dispersed in the organic solvent by, for example, mixing the particles of metal oxide, the organic substance having a reactive functional group, an organic solvent, and if necessary, an optional additive, and furthermore if necessary, subjecting the obtained mixture to a treatment such as an ultrasonic treatment.

Examples of the organic solvent may include ketones such as methyl ethyl ketone, methyl isobutyl ketone, acetone, and cyclohexanone; aromatic hydrocarbons such as benzene, toluene, xylene, and ethylbenzene; alcohols such as methanol, ethanol, isopropyl alcohol, n-butanol, and iso-butanol; ethers such as ethylene glycol monomethyl ether, ethylene glycol monoethyl ether, ethylene glycol monobutyl ether, diethylene glycol monomethyl ether, and diethylene glycol monoethyl ether; esters such as ethyl acetate, butyl acetate, ethyl lactate, γ-butyrolactone, propylene glycol monomethyl ether acetate, and propylene glycol-monoethyl ether acetate; and amides such as dimethylformamide, N,N-dimethylacetoacetamide, and N-methyl pyrrolidone. One type of the organic solvent may be used alone, or two or more types thereof may be used in combination at any ratio.

Examples of the optional additive may include a metal chelating agent. One type or the additive may be used alone, or two or more types thereof may be used in combination at any ratio.

When the reactive modified metal oxide particles are obtained as the suspension in which the particles are dispersed in the organic solvent, it is preferable that the suspension is used as it is in production of the first binder from the viewpoint of convenience of production. In this case, it is preferable that the aforementioned suspension is adjusted so as to contain the reactive modified metal oxide particles in an amount of 1% by weight to 50% by weight by adjusting conditions such as the amount of the solvent.

For mixing, a mixer such as a bead mill is preferably used. By the mixing, secondary particles or much higher order particles can be pulverized to a degree of primary particles, and the surface of the particles in the primary particle state can be treated. Thus, a uniform surface treatment can be performed.

Further, it is preferable that the mixture is subjected to an ultrasonic treatment, if necessary. In the ultrasonic treatment, for example, a device such as an ultrasonic cleaner, an ultrasonic homogenizer, and an ultrasonic dispersion device may be used. By such a treatment, a good suspension can be obtained.

As the reactive modified metal oxide particles, commercially available particles may be used. Examples of a slurry of reactive modified metal oxide particles containing $ZrO_2$ as the metal oxide may include a product with a trade name of "ZR-010" (available from SOLAR CO., Ltd., solvent: methyl ethyl ketone, particle content: 30%, organic substance that modifies a surface and has a reactive functional group: isocyanate having a polymerizable functional group, volume average particle diameter: 15 nm). Examples of a slurry of reactive modified metal oxide particles containing $TiO_2$ as the metal oxide may include a product with a trade name of "NOD-742GTF" (available from Nagase ChemteX Corporation, solvent: polyethylene glycol monomethyl ether, particle content: 30%, volume average particle diameter: 48 nm).

One type of the high refractive index nanoparticles may be used alone, or two or more types thereof may be used in combination at any ratio.

The volume average particle diameter of the high refractive index nanoparticles is preferably 5 nm or more, more preferably 10 nm or more, and particularly preferably 15 nm or more, and is preferably less than 100 nm, and more preferably 50 nm or less. When the volume average particle diameter of the high refractive index nanoparticles is equal to or less than the upper limit of the above-described range, coloring of the first light-scattering layer can be reduced to improve the light transmittance. The high refractive index nanoparticles of such a size can be easily dispersed. Herein, when the high refractive index nanoparticles are aggregated to form secondary particles or higher order particles, the range of the volume average particle diameter may be the range of primary particle diameter.

The ratio of the high refractive index nanoparticles relative to the total amount of the first binder is preferably 20% by weight or more, and more preferably 30% by weight or more, and is preferably 80% by weight or less, and more preferably 70% by weight or less. When the ratio of the high refractive index nanoparticles is equal to or more than the lower limit of the above-described range, the refractive index of the first binder can be increased. When it is equal to or less than the upper limit, increase in the hardness of the first binder can be suppressed, and decrease in adhesive force can be suppressed. When fine particles as described above are used as the high refractive index nanoparticles, the sum total of surface areas of the particles is increased, and thus the fine particles interact with polymer molecule chains or monomer molecules contained in the first binder. The interaction may affect the adhesive force. Therefore, it is preferable that the amount of the high refractive index nanoparticles falls within the aforementioned range.

The first binder may contain a plasticizer. When a plasticizer is used, the viscosity of the first binder can be decreased to increase the adhesiveness of the first light-scattering layer 120. In particular, when the first binder contains the high refractive index nanoparticles, the viscosity of the first binder tends to be increased to decrease the adhesiveness of the first light-scattering layer 120. Therefore, use of the plasticizer is preferable.

Examples of the plasticizer may include polybutene, a vinyl ether compound, a polyether compound (including polyalkylene oxide and functionalized polyalkylene oxide), an ester compound, a polyol compound (for example, glycerol), a petroleum resin, a hydrogenated petroleum resin, and a styrene-based compound (for example, α-methylstyrene). Among these, an ester compound ice, preferred since the miscibility with the adhesive material is good and the refractive index is comparatively high. In particular, an ester compound having an aromatic ring, such as a benzoic acid-based compound and a phthalic acid-based compound, is preferred.

Examples or the benzoic acid ester that may be used as the plasticizer may include diethylene glycol dibenzoate, dipropylene glycol dibenzoate, benzyl benzoate, and 1,4-cyclohexane dimethanol dibenzoate. Among these, particularly preferable examples thereof may include benzoic acid-based ester compounds such as dipropylene glycol dibenzoate and benzyl benzoate; and phthalic acid-based ester compounds such as dimethyl phthalate, diethyl phthalate, dibutyl phthalate, butyl benzyl phthalate, dicyclohexyl phthalate, and ethylphthalyl ethyl glycolate. Examples of the commercially available plasticizer may include a product with a trade name of "BENZOFLEX 9-88SG" (available from Eastman Chemical Company). One type of the plasticizer may be used alone, or two or more types thereof may be used in combination at any ratio.

The ratio of the plasticizer in the first binder relative to 100 parts by weight of the polymer is preferably 1 part by weight or more, and more preferably 5 parts by weight or more, and is preferably 35 parts by weight or less, and more preferably 30 parts by weight or less.

The refractive index of the first binder is usually 1.5 or more, preferably 1.52 or more, and more preferably 1.55 or more, and is usually 1.7 or less, preferably 1.65 or less, and more preferably 1.6 or less. When the refractive index of the first binder is equal to or more than the lower limit of the above-described range, D1/L1 can be easily adjusted within a suitable range using a small amount of the first light-scattering particles. Therefore, use of excessively large amount of the first light-scattering particles can be avoided. It is thus easy to smoothen the surface of the first light-scattering layer 120 and to increase the adhesiveness of the first light-scattering layer 120. When the refractive index is equal to or less than the upper limit, the change in adhesiveness over time can be decreased, and the layer can be made soft.

It is preferable that the first light-scattering layer 120 is formed only of the first light-scattering particles and the first binder. Therefore, it is preferable that the amount of the first binder in the first light-scattering layer 120 is set so that the sum of the ratio of the first light-scattering particles and the ratio of the first binder is 100% by weight.

(1.2.4. Thickness of First Light-Scattering Layer 120)

The thickness D1 of the first light-scattering layer 120 is usually 5 μm or more, preferably 10 μm or more, and more preferably 15 μm or more, and is usually 50 μm or less, preferably 40 μm or less, and more preferably 25 μm or less. When the thickness of the first light-scattering layer 120 is equal to or more than the lower limit of the above-described range, light can be sufficiently scattered. When it is equal to or less than the upper limit, the surface of the first light-scattering layer can be made flat.

(1.2.5. Method for Producing First Light-Scattering Layer 120)

The first light-scattering layer 120 may be produced, for example, by applying a coating liquid suitable for formation of the first light-scattering layer 120 onto a desired supporting surface, and if necessary, performing a curing treatment such as drying. In this case, a liquid composition containing the first light-scattering particles and the first binder may be used as the coating liquid.

The coating liquid may contain an optional component, if necessary. Examples of the optional component may include an additive such as a silane coupling agent and a curing agent; and a solvent.

Examples of the silane coupling agent may include vinyltrimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldimethoxysilane, 3-methacryloxypropyltrimethoxysilane, 3-acryloxypropyltrimethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltrimethoxysilane, 3-aminopropyltrimethoxysilane, 3-aminopropyltrimethoxysilane, 3-triethylsilyl-N-(1,3-dimethyl-butylidene)propylamine, N-phenyl-3-aminopropyltrimethoxysilane, 3-ureidopropyltriethoxysilane, 3-mercaptopropylmethyldimethoxysilane, 3-mercaptopropyltrimethoxysilane, bis(triethoxysilylpropyl)tetrasulfide, and 3-isocyanatepropyltriethoxysilane. Examples of the commercially available silane coupling agent may include a product with a trade name of "KBM-803" (available from. Shin-Etsu Chemical Co., Ltd.). One type of the silane coupling agent may be used alone, or two or more types thereof may be used in combination at any ratio.

The amount of the silane coupling agent relative to 100 parts by weight of the polymer in the first binder is preferably 0.05 part, by weight or more, and more preferably 0.2 parts by weight or more, and is preferably 5 parts by weight or less, and more preferably 3 parts by weight or less.

Examples of the curing agent may include an isocyanate compound. Specific examples of the curing agent may include an addition polymer of isocyanate containing isophorone diisocyanate (for example, "NY-260A" available from Mitsubishi Chemical Corporation). One type of the curing agent may be used alone, or two or more types thereof may be used in combination at any ratio.

The amount of the curing agent relative to 100 parts by weight of the polymer in the first binder is preferably 0.01 parts by weight or more, and more preferably 0.05 parts by weight or more, and is preferably 5 parts by weight or less, and more preferably 1 part by weight or less.

Examples of the solvent may include the same examples as those of the organic solvent used in production of the reactive modified metal oxide particles. One type of the solvent may be used alone, or two or more types thereof may be used in combination at any ratio.

In production of each component to be contained in the coating liquid, the respective components may be obtained as a solution or a suspension containing the respective components dissolved or dispersed in a solvent. When each component to be contained in the coating liquid is a commercially available product, the respective components may be obtained in a form of solution or suspension. In such a case, the solvent contained in the solution or suspension may be used as a part or all of the solvent of the coating liquid.

The amount of the solvent relative to 100 parts by weight of a total solid content of the coating liquid is preferably 50 parts weight or more, and more preferably 100 parts by weight or more, and is preferably 300 parts by weight or less, and more preferably 250 parts by weight or less. Herein, the solid content of the coating refers to a component that remains after drying of the coating liquid.

For example, the aforementioned coating liquid is applied onto a surface 112D of the substrate film layer 112, and treated for curing, if necessary. In this manner, the first light-scattering layer 120 may be produced. The first light-scattering layer 120 thus obtained may contain the components contained in the coating liquid. However, a part of the components may be changed by a reaction or may be volatilized and disappear. For example, by a drying step, reactive components such as the silane coupling agent and the curing agent may be reacted to form another substance, or the solvent may be volatilized and disappear.

[1.3. Substrate Plate Layer 130]

As the substrate plate layer 130, a transparent sheet is usually used. As an example of the material for the substrate plate layer, glass or a transparent resin may be used. Examples of the transparent resin usable for the substrate plate layer 130 may include a thermoplastic resin, a thermosetting resin, an ultraviolet curable resin, and an electron beam curable resin. Among these, a thermoplastic resin is preferred in terms of easy processing. Examples of the thermoplastic resin may include a polyester resin, a polyacrylate resin, and a cycloolefin resin. One type thereof may be used alone, or two or more types thereof may be used in combination at any ratio.

The refractive index of the substrate plate layer 130 is preferably close to the refractive index of the first binder of the first light-scattering layer 120. Specifically, a difference between the refractive index of the substrate plate layer 130 and the refractive index of the first binder is preferably 0.15 or less, more preferably 0.1 or less, and further preferably 0.05 or less. In this manner, the light extraction efficiency of the organic EL light-emitting device 100 can be enhanced.

When the substrate plate layer 130 is formed of a resin, the thickness of the substrate plate layer 130 is preferably 20 µm to 300 µm. When the substrate plate layer 130 is formed of glass, the thickness of the substrate plate layer 130 is preferably 10 µm to 1,100 µm. The substrate plate layer 130 may or may not have flexibility. Therefore, for example, inflexible glass having a thickness of 700 µm may be employed as the substrate plate layer.

[1.4. Second. Light-Scattering Layer 140]

The second light-scattering layer 140 is a layer that can function as a light scattering structure for scattering light, and contains second light-scattering particles. The second light-scattering layer 140 usually contains a second binder in order to hold the second light-scattering particles in the second light-scattering layer 140. In the second light-scattering layer 140, the second light-scattering particles are dispersed in the second binder. The second binder is usually transparent. Light passing through the transparent second binder is reflected on the interface between the second binder and the second light-scattering particles so as to be scattered.

When the second light-scattering layer 140 contains the second light-scattering particles, it is preferable that the second light-scattering layer 140 satisfies $(D1/L1+D2/L2)<6$. Herein, "D2" represents the thickness of the second light-scattering layer 140. "L2" represents the mean free path of light scattering in the second light-scattering layer 140. Specifically, a value of $(D1/L1+D2/L2)$ is preferably 0.5 or more, more preferably 0.8 or more, and particularly preferably 1.4 or more, and is preferably 6 or less, and more preferably 4.5 or less. Thereby the light extraction efficiency of the organic EL light-emitting device 100 can be further enhanced.

As the second light-scattering particles, particles selected from the particles described as the first light-scattering particles may be optionally used. One type of the second light-scattering particles may be used alone, or two or more types thereof may be used in combination at any ratio.

The refractive index of the second light-scattering particles is usually 1.2 or more, preferably 1.3 or more, and more preferably 1.4 or more, and is usually 1.6 or less, preferably 1.55 or less, and more preferably 1.5 or less. When the refractive index of the second light-scattering particles is equal to or more than the lower limit of the above-described range, variation of scattering property due to fluctuation of the particle diameter and the film thickness can be suppressed. When the refractive index is equal to or less than the upper limit, light can be sufficiently scattered.

The average particle diameter of the second light-scattering particles is preferably 0.2 or more, more preferably 0.3 µm or more, and particularly preferably 0.4 µm or more, and is preferably 2 µm or less, more preferably 1 µm or less, and particularly preferably 0.9 µm or less. When the average particle diameter of the second light-scattering particles is equal to or more than the lower limit of the above-described range, visible light can be stably scattered by the second light-scattering particles. When the average particle diameter is equal to or less than the upper limit, visible light can be efficiently scattered by the second light-scattering particles. Further, the layers each contained in the light-emitting element layer 150 are required to have flatness. Therefore, it is preferable that the average particle diameter of the second light-scattering particles contained in the second light-scattering layer 140 disposed in the vicinity of the light-emitting element layer 150 is small as described above.

The ratio of the second light-scattering particles in the second light-scattering layer 140 is preferably 0.5% by weight or more, and more preferably 1% by weight or more, and is preferably 40% by weight or less, and more preferably 20% by weight or less. When the ratio of the second light-scattering particles falls within the above-described range, a desired light-scattering effect can be obtained to suppress color unevenness depending on a polar angle direction on the light-emitting surface 100U.

As the second binder, a resin is usually used. When an adhesive having adhesiveness is used as the resin, for example, a resin selected from a range of the adhesive described as the first binder may be optionally used.

When the second binder has no adhesiveness, as the resin that can be used as the second binder, for example, a thermoplastic resin, a thermosetting resin, or an energy ray curable resin such as a ultraviolet curable resin and an electron beam curable resin may be used. In particular, a thermosetting resin and an energy ray curable resin are preferred from the viewpoints of high hardness and production efficiency. Examples of the thermoplastic resin may include a polyester resin, a polyacrylate resin, and a cycloolefin resin. Examples of the ultraviolet curable resin may include an epoxy resin, an acrylic resin, a urethane resin, an ene/thiol resin, and an isocyanate resin. For the resins, a resin having a plurality of polymerizable functional groups is preferred. One type thereof may be used alone, or two or more types thereof may be used in combination at any ratio.

The refractive index of the second binder is usually 1.52 or more, preferably 1.55 or more, and more preferably 1.65 or more, and is usually 1.9 or less, preferably 1.85 or less, and more preferably 1.8 or less. When the refractive index of the second binder is equal to or more than the lower limit of the above-described range, D2/L2 can be easily adjusted within a suitable range even if a small amount of the second light-scattering particles are used. Therefore, use of excessively large amount of the second light-scattering particles can be avoided. Accordingly, the surface of the second light-scattering layer 140 can be easily made smooth. When it is equal to or less than the upper limit, a difference in refractive index between the light-emitting element layer 150 and the second binder can be decreased to suppress reflection. Further, particles during mixing the high refractive index nanoparticles can be easily dispersed.

It is preferable that the second light-scattering layer 140 is formed only of the second light-scattering particles and the second binder. Therefore, it is preferable that the amount of the second binder in the second light-scattering layer 140 is set so that the sum of the ratio of the second light-scattering particles and the ratio of the second binder is 100% by weight.

The thickness D2 of the second light-scattering layer 140 is usually 1 μm or more, preferably 2 μm or more, and more preferably 3 μm or more, and is usually 30 μm or less, preferably 20 μm or less, and more preferably 10 μm or less. When the thickness of the second light scattering layer 140 is equal to or more than the lower limit of the above-described range, the second light-scattering layer 140 can sufficiently scatter light. When it is equal to or less than the upper limit, the surface during formation of a film can be made uniform and even.

The second light-scattering layer 140 may be produced, for example, by applying a coating liquid suitable for formation of the second light-scattering layer onto a desired supporting surface, and if necessary, performing a curing treatment such as drying.

As the coating liquid, a liquid composition containing the second light-scattering particles and the second binder may be used. The coating liquid may further contain a solvent, if necessary. Examples of the solvent may include the same examples as those of the organic solvent used in production of the reactive modified metal oxide particles. One type of the solvent may be used alone, or two or more types thereof may be used in combination at any ratio. The ratio of the solvent in the coating liquid may be 10% by weight to 80% by weight.

The second light-scattering layer 140 may be produced by, for example, applying the aforementioned coating liquid onto a surface 130D of the substrate plate layer 130, and subjecting it to a curing treatment, if necessary. The second light-scattering layer 140 thus obtained may contain the components contained in the coating liquid. However, a part of the components may be changed by a reaction or may be volatilized and disappear.

[1.5. Light-Emitting Element. Layer 150]

The light-emitting element layer 150 usually includes two or more electrode layers and a light-emitting layer that is provided between the electrode layers and can generate light by application of a voltage thereto from the electrode layers. Such a light-emitting element layer may be formed by sequentially forming layers such as the electrode layers and the light-emitting layer on a substrate plate by a known method such as sputtering. In this embodiment, the light-emitting element layer 150 including the transparent electrode layer 151, the light-emitting layer 152, and the reflecting electrode layer 153 in this order will be described as an example.

A light-emitting material for the light-emitting layer 152 is not particularly limited, and a known material may be appropriately selected. As the light-emitting material for the light-emitting layer 142, one type thereof may be used alone, or two or more types thereof may be used in combination at any ratio. The light-emitting layer 152 may be a layer having a single-layer structure including only one layer. Further, the light-emitting layer 152 may be a layer having a multilayer structure including a plurality of layers in combination for adaptation to use as a light source. With such a structure, the light-emitting layer 152 may be a layer that generates white light or light of color close to white.

As the material for the electrode layers, one type thereof may be used alone, or two or more types thereof may be used in combination at any ratio. The electrode layers each may be a layer having a single-layer structure including only one layer, or a layer having a multilayer structure including two or more layers.

The light-emitting element layer 150 may further include, between the transparent electrode layer 151 and the reflecting electrode layer 153, an optional layer (not shown), such as a hole injection layer, a hole transport layer, an electron transport layer, and an electron injection layer in addition to the light-emitting layer 152. Furthermore, the light-emitting element layer 150 may include an optional component such as a wiring for applying electricity to the transparent electrode layer 151 and the reflecting electrode layer 153, and a peripheral structure for sealing the light-emitting layer 152.

The material constituting a layer that may be contained in the light-emitting element layer 150 is not particularly limited. Specific examples thereof may include the following.

Examples of a material for the transparent electrode layer may include indium tin oxide (ITO).

Examples of a material for the reflecting electrode layer may include aluminum and silver.

Examples of a material for a hole injection layer may include a starburst aromatic diamine compound.

Examples of a material for a hole transport layer may include a triphenyldiamine derivative.

Examples of a host material for a yellow light-emitting layer may include a triphenyldiamine derivative.

Examples of a dopant material for the yellow light-emitting layer may include a tetracene derivative.

Examples of a material for green light-emitting layer may include a pirazoline derivative.

Examples of a host material for a blue light-emitting layer may include an anthracene derivative. Examples of a dopant material for the blue light-emitting layer may include a perylene derivative.

Examples of a material for a red light-emitting layer may include a europium complex.

Examples of a material for an electron transport layer may include an aluminum quinoline complex (Alq).

The light-emitting layer 152 may be a combination of a plurality of layers for constituting a light-emitting layer that generates light of colors in complementary relationship. Such a light-emitting layer is called a lamination type or a tandem type. A combination of complementary colors relation may be, for example, yellow/blue, green/blue/red, or the like.

[1.6. Sealing Layer 160]

The sealing layer 160 is a layer for blocking water. It is preferable that the sealing layer 160 has a function of blocking not only water but also oxygen. In this manner, the organic material in the light-emitting element layer 150 can be prevented from deteriorating due to water vapor and oxygen. The sealing layer 160 may be formed, for example, of an organic material such as a resin or an inorganic material such as metal and a metal compound. Such a sealing layer 160 may be formed, for example, by bonding a sealing film formed of an appropriate material or the like to the surface of the light-emitting element layer 150.

[1.7. Main Advantages of Organic EL Light-Emitting Device 100]

In the organic EL light-emitting device 100 having the aforementioned configuration, when a voltage is applied by the transparent electrode layer 151 and the reflecting electrode layer 153, the light-emitting layer 152 generates light. The light thus generated passes through the transparent electrode layer 151 or is reflected by the reflecting electrode layer 153 and then passes through the light-emitting layer 152 and the transparent electrode layer 151. Subsequently, the light passes through the second light-scattering layer 140, the substrate plate layer 130, the first light-scattering layer 120, the substrate film layer 112, and the concavo-convex structure layer 111, and exits through the light-emitting surface 100U. In this case, when the aforementioned light passes through the first light-scattering layer 120, it is scattered due to reflection on the surface of the first light-scattering particles contained in the first light-scattering layer 120. Further, when the aforementioned light passes through the second light-scattering layer 150, it is scattered due to reflection on the surface of the second light-scattering particles contained in the second light-scattering layer 140.

Since prisms 171 are provided on the light-emitting surface 100U, the aforementioned light easily enters the light-emitting surface 100U at an incident angle at which the light can pass through the light-emitting surface 100U.

In addition to these matters, the organic EL light-emitting device 100 according to this embodiment satisfies the aforementioned requirements (A) and (B). In this manner, light generated in the light-emitting layer 152 easily exits through the light-emitting surface 100U to the outside. Accordingly, the organic EL light-emitting device 100 according to this embodiment can have high light extraction efficiency.

The light extraction efficiency may be evaluated on the basis of a light extraction efficiency Q that is obtained by comparison of the organic EL light-emitting device 100 according to this embodiment with a control light-emitting device. Herein, the light extraction efficiency Q is obtained by equation: "Q=(total light flux from the organic EL light-emitting device 100 according to this embodiment)/(total light flux from the control light-emitting device)". As the control light-emitting device, a light-emitting device that is differentiated from the organic EL light-emitting device 100 according to this embodiment only on the point of the presence or absence of a part of the layers may be used. For example, a light-emitting device having the same structure as that of the organic EL light-emitting device 100 except that the layers from the light-emitting surface structure layer 110 to the second light-scattering layer 140 are not provided may be used as the control light-emitting device. Alternatively, a light-emitting device additionally having another difference in configuration that does not largely affect the light extraction efficiency may also be used.

With the organic EL light-emitting device 100, color unevenness may usually be reduced. Herein, the color unevenness represents a phenomenon in which the color of light observed is different depending on an observation direction during observation of the light-emitting surface 100U.

2. Second Embodiment

In the aforementioned first embodiment, the second light-scattering layer containing the second light-scattering particles and the second binder has been described as an example of a light-scattering structure. However, the light-scattering structure is not limited to such a light-scattering layer, and any structure capable of scattering light generated in the light-emitting layer may be used. Hereinafter, an example of organic EL light-emitting device having a light-scattering structure other than the second light-scattering layer containing the second light-scattering particles and the second binder will be described with reference to the drawings.

Figure 4:
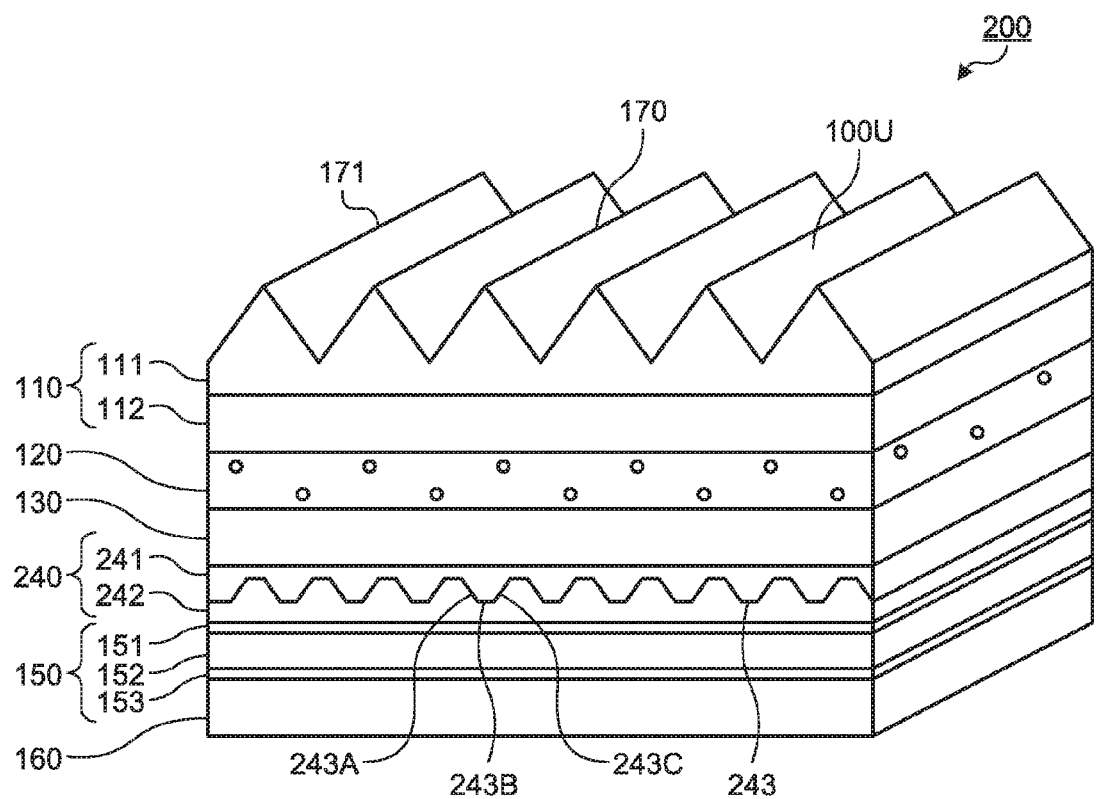
FIG. 4 is a perspective view schematically showing an organic EL light-emitting device according to a second embodiment of the present invention.

FIG. 4 is a perspective view schematically showing an organic EL light-emitting device 200 according to a second embodiment of the present invention. In the organic EL light-emitting device 200 shown in FIG. 4, the same portions as those in the organic EL light-emitting device 100 according to the first embodiment are denoted by the same numerals used in the description of the first embodiment.

As shown in FIG. 4, the organic EL light-emitting device 200 according to the second embodiment of the present invention has the same configuration as that of the organic EL light-emitting device 100 according to the first embodiment except that a light-scattering structure layer 240 is provided in place of the second light-scattering layer 140.

The light-scattering structure layer 240 has a first light-transmitting layer 241 and a second light-transmitting layer 242 that are different from each other in the refractive indices. The first light-transmitting layer 241 and the second light-transmitting layer 242 are in contact with each other at an interface 243. The first light-transmitting layer 241 and the second light-transmitting layer 242 are formed to have non-uniform thicknesses. Therefore, the interface 243 is a non-flat concavo-convex surface, and includes a plurality of surface portions 243A, 243B, and 243C that are not parallel to one another.

When light passes through the aforementioned interface 243, the light is usually refracted depending on an incident angle to the interface 243. Herein, the interface 243 includes the plural surface portions 243A to 243C that are not parallel to one another as described above. Therefore, light passing through the interface 243 is refracted at each of the surface portions 243A to 243C. Accordingly, the light passing through the interface 243 travels in a plurality of different directions. Consequently, light can be scattered by the light-scattering structure layer 240.

The organic EL light-emitting device 200 having the light-scattering structure layer 240 in place of the second light-scattering layer 140 may be used in the same manner as the organic EL light-emitting device 100 according to the first embodiment, and the same advantages as those of the organic EL light-emitting device 100 according to the first embodiment can be obtained.

3. Modifications

The present invention is not restricted to the embodiments described above, and may be implemented with further modifications.

Figure 5:
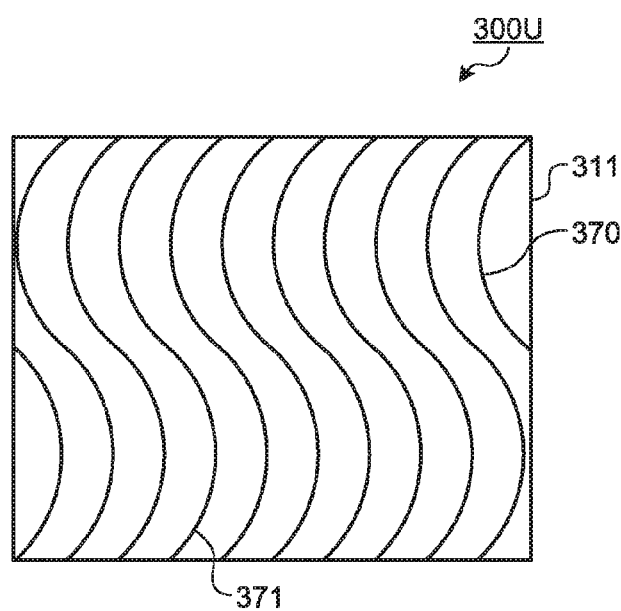
FIG. 5 is a plan view schematically showing a light-emitting surface of a concavo-convex structure layer according to an example.

For example, the concave portions and the convex portions such as prisms contained in the concavo-convex structures are not limited to those extending linearly in one direction. FIG. 5 is a plan view schematically showing a light-emitting, surface 300U of a concavo-convex structure layer 311 according to an example. As shown in FIG. 5, a concavo-convex structure 370 in a streak array pattern may be provided, for example, as a group of prisms 371 each of which extends in a curved manner in a plurality of different directions.

For example, unlike the aforementioned embodiments, the depth of the concave portions and the height of the convex portions in the concavo-convex structure in a streak array pattern may not be constant and may be different.

In the aforementioned embodiments, explanation has been made referring to examples wherein each of the prisms 171 is continuously provided over the entire light-emitting surface 100U in the extending direction of the prisms 171. However, the concave portions and the convex portions like the prisms 171 may not be necessarily provided continuously over the entire light-emitting surface 100U in the extending direction of the concave portions and the convex portions. For example, spacing for separating the respective prisms 171 into a plurality of prisms in the extending direction of the prisms 171 (depth direction in FIG. 1) may be provided on the concavo-convex structure layer 111 of the organic EL light-emitting device 100 according to the first embodiment as shown in FIG. 1.

For example, even when the reflecting electrode layer 153 of the above-described embodiments is replaced by a multilayer member including a transparent electrode layer and a reflective layer in combination, a device providing the same effects as those of the organic EL light-emitting device according to the above-described embodiments may be obtained.

For example, the reflecting electrode layer 153 of the above-described embodiments may be replaced by a transparent electrode layer. By such replacement, an organic EL light-emitting device capable of emitting light from both surfaces may be obtained.

Furthermore, the organic EL light-emitting device may not necessarily include the substrate film layer 112, the substrate plate layer 130, and the sealing layer 160. The organic EL light-emitting device may further include an optional layer in addition to the aforementioned layers.

4. Application of Organic EL Light-Emitting Device

The organic EL light-emitting device of the present invention may be used, for example, for applications such as a lighting apparatus and a backlight device. A lighting apparatus has the organic EL light-emitting device of the present invention as a light source, and may include optional components such as a member holding the light source and a circuit for supplying power. A backlight device has the organic EL light-emitting device of the present invention as a light source, and may include optional components such as a housing, a circuit for supplying power, a diffusion plate for making emitted light uniform, a diffusion sheet, and a prism sheet. The backlight device may be used as a backlight of a display device of controlling pixels to display an image such as a liquid crystal display device, and a display device of displaying a fixed image such as a sign board.

EXAMPLES

Hereinafter, the present invention will be specifically described by showing Examples. However, the present invention is not limited to the following Examples. The present invention may be freely modified for implementation without departing from the scope of claims of the present invention and equivalents thereto.

Unless otherwise specified, "%" and "part" that represent amounts of materials in the following Examples and Comparative Examples are based on weight. Unless otherwise specified, operations in Examples and Comparative Examples were performed under environment of normal temperature and normal pressure.

In the following Examples and Comparative Examples, the mean free path of light scattering in a light-scattering layer was calculated with respect to light having a wavelength of 550 nm in vacuum by the aforementioned method in accordance with the Mie scattering theory.

I. Examples and Comparative Examples Based on Actual Measuring

Example 1

(1-1. Preparation of Ultraviolet Curable Resin Composition A)

A plastic container was charged with 44 parts by weight of a slurry containing reactive modified zirconia oxide as high refractive index nanoparticles ("ZR-010" available from SOLAR CO., Ltd., solvent: methyl ethyl ketone, particle content: 30%, particle specific gravity: about 4, volume average particle diameter of particles of reactive modified zirconia oxide: 15 nm, refractive index: about 1.9), 33 parts by weight of methyl ethyl ketone as a solvent, 1.3 parts by weight of silicone particles as second light-scattering particles (volume average particle diameter: 0.5 μm, specific gravity: 1.32, refractive index: 1.43), and 500 parts by weight of zirconia balls for dispersion ("YTZ-0.5" available from NIKKATO CORPORATION).

This container was disposed on a ball mill rack, and ball mill dispersion was performed at a rate of 2 rotations per second for 1 hour. After the ball mill dispersion, the content of the container was sieved to remove the zirconia balls, thereby obtaining a mixture 1.

To the mixture 1, 8.7 parts by weight of an ultraviolet curable resin ("P5790PS3A" available from Daido Chemical Corporation, specific gravity: 1.1) was added, and the mixture was stirred for 15 minutes to obtain an ultraviolet curable resin composition A.

(1-2. Measurement of Refractive Index of Binder (Second Binder) of Second Light-Scattering Layer)

An ultraviolet curable resin composition A' containing no silicone particles was obtained by the same operation as in the aforementioned step (1-1) except that silicone particles were not added.

The curable resin composition A' was applied onto a surface of a glass plate by a bar coater so that the thickness after drying was 10 μm, and cured by irradiation with ultraviolet rays of 500 mJ. The refractive index of the layer of the cured resin composition A' was measured by an ellipsometer ("M-2000" manufactured by J. A. Woollam. Japan) and was found to be 1.63.

(1-3. Production of Organic EL Element)

The aforementioned ultraviolet curable resin composition A was applied by spin coating onto a surface of a glass substrate plate having a thickness of 0.7 mm and a refractive index of 1.52, and the thickness was adjusted Sc) that the thickness of the final film was 3 μm. Subsequently, the glass substrate plate was placed on a hot plate at 80° C. so as to dry the layer of the resin composition A for 5 minutes. Then, the layer was cured by irradiation with ultraviolet rays of 500 mJ. In this manner, a second light-scattering layer was formed on the glass substrate plate.

On the obtained second light-scattering layer, further a transparent electrode layer having a thickness of 100 nm, a hole transport layer having a thickness of 10 nm, a yellow light-emitting layer having a thickness of 20 nm, a blue light-emitting layer having a thickness of 15 nm, an electron transport layer having a thickness of 15 nm, an electron injection layer having a thickness of 1 nm, and a reflecting electrode layer having a thickness of 100 nm were formed in this order. All of the layers from the hole transporting layer to the electron transport layer were formed of organic materials. The yellow light-emitting layer and the blue light-emitting layer had emission spectra that are different from each other.

Materials forming each layer from the transparent electrode layer to the reflecting electrode layer were as follows.

Transparent electrode layer: tin-doped indium oxide (ITO)

Hole transport layer: 4,4'-bis[N-(naphthyl)-N-phenylamino]biphenyl (α-NPD)

Yellow light-emitting layer: 1.5% by weight rubrene-doped α-NPD

Blue light-emitting layer: 10% by weight iridium complex-doped 4,4'-dicarbazolyl-1,1'-biphenyl (CBP)

Electron transport layer: phenanthroline derivative (BCP)

Electron injection layer: lithium fluoride (LiF)

Reflecting electrode layer: Al

The transparent electrode layer was formed by a reactive sputtering method using an ITO target.

The layers from the hole injection layer to the reflecting electrode layer were formed by disposing in a vacuum vapor deposition device a glass substrate plate having the transparent electrode layer formed thereon, and then sequentially vapor-depositing the materials for the layers from the hole transport layer to the reflecting electrode layer by a resistance heating. The vapor deposition was performed at a system internal pressure of $5 \times 10^{-3}$ Pa and an evaporation rate of 0.1 nm/s to 0.2 nm/s.

Subsequently, a wiring for applying electricity was attached to the electrode layer, and the layers from the hole transport layer to the reflecting electrode layer were sealed with a sealing substrate plate. Thus, a light-emitting element having a layer structure of (glass substrate plate)/(second-light-scattering layer)/(transparent electrode layer)/(hole transport layer)/(yellow light-emitting layer)/(blue light-emitting layer)/(electron transport layer)/(electron injection layer)/(reflecting electrode layer)/(sealing substrate plate) was produced.

(1-4. Preparation of Adhesive Composition B)

A plastic container was charged with 85 parts by weight of a slurry containing reactive modified zirconia oxide as high refractive index nanoparticles ("ZR-010" available from SOLAR CO., Ltd., solvent: methyl ethyl ketone, particle content: 30%, particle specific gravity: about 4, volume average particle diameter of particles of reactive modified zirconia oxide: 15 nm, refractive index: about 1.9), 5 parts by weight of silicone particles as first light-scattering particles ("XC-99" available from Momentive Performance Materials Inc., volume average particle diameter: 0.7 μm, specific gravity: 1.32, refractive index: 1.43), and 500 parts by weight of zirconia balls for dispersion ("YTZ-0.5" available from NIKKATO CORPORATION).

This container was disposed on a ball mill rack, and ball mill dispersion was performed at a rate of 2 rotations per second for 30 minutes. After the ball mill dispersion, the content of the container was sieved to remove the zirconia balls, thereby obtaining a mixture 2.

To the mixture 2, 100 parts by weight of an acrylic adhesive ("X-311033S" available from SAIDEN CHEMICAL INDUSTRY CO., LTD., solid content: 35%, specific gravity: 1.1) and 5 parts by weight of a plasticizer ("BENZOFLEX 9-88SG" available from. Eastman Chemical Company, diethylene glycol dibenzoate, specific gravity: about 1.0) were added, and the mixture was stirred for 15 minutes. Subsequently, 1 part by weight of a silane coupling agent ("KBM-803" available from. Shin-Etsu Chemical Co., Ltd., 3-mercaptopropyltrimethoxysilane) and 0.6 parts by weight of a curing agent ("NY-260A" available from Mitsubishi Chemical Corporation) were added, and the mixture was stirred for 15 minutes to obtain an adhesive composition B for forming a first light-scattering layer.

(1-5. Measurement of Refractive Index of Binder (First Binder) of First Light-Scattering Layer)

An adhesive composition B' containing no silicone particles was obtained by the same operation as in the above-described step (1-4) except that silicone particles were not added.

The adhesive composition B' was applied onto a surface of a glass plate so that the thickness after drying was 10 μm, and dried at 80° C. for 5 minutes to form a test adhesive layer. The refractive index of the test adhesive layer was measured by an ellipsometer ("M-2000" manufactured by J. A. Woollam Japan) and found to be 1.56.

(1-6. Preparation of Scattering Adhesive Sheet)

The adhesive composition B obtained above was applied onto a surface or a substrate film layer having a thickness of 100 μm ("ZEONOR film ZF14-100" available from ZEON Corporation, refractive index: 1.52) so that the thickness after drying was 35 μm, and dried at 80° C. for 5 minutes. Thus, a first light-scattering layer (light-scattering adhesive layer) having adhesiveness was formed on the substrate film layer, to obtain a scattering adhesive sheet having the substrate film layer and the first light-scattering layer.

(1-7. Formation of Concavo-Convex Structure Layer)

Onto a surface of the scattering adhesive sheet opposite to the first light-scattering layer, a UV curable resin ("P5790PS3C" available from Daido Chemical Corporation) was applied so as to have a thickness of 10 μm. On a film of the applied UV curable resin, a metal mold was disposed. On the surface of this metal mold, a concavo-convex structure in a streak array pattern in which prisms each having a cross section of isosceles triangle with an apex angle of 60° at pitches of 10 μm were uniformly disposed. The metal mold was pressed onto the film of the UV curable resin, and the film of the UV curable resin was irradiated with ultraviolet rays of 500 mJ through the first light-scattering layer. As a result, the film of the UV curable resin was cured to form a concavo-convex structure layer on a side of the substrate film layer opposite to the first light-scattering layer.

(1-8. Production of Organic EL Light-Emitting Device)

The scattering adhesive sheet having the concavo-convex structure layer was bonded to a surface of the light-emitting element obtained in the above-described step (1-3) on a side of the glass substrate plate. Thus, an organic EL light-emitting device having a layer structure of (concavo-convex structure layer)/(substrate film layer)/(first light-scattering layer formed of adhesive composition B)/(glass substrate plate)/(second light-scattering layer)/(transparent electrode layer)/(hole transport layer)/(yellow light-emitting layer)/(blue light-emitting layer)/(electron transport layer)/(electron injection layer)/(reflecting electrode layer)/(sealing substrate plate) was obtained.

Example 2

(2-1. Preparation of Adhesive Composition C)

A reaction vessel equipped with a cooling tube, a nitrogen inlet tube, a thermometer, and a stirrer alas prepared. 233 parts of ethyl acetate as a solvent; 30 parts of butyl acrylate, 70 parts of phenoxyethyl acrylate, 0.5 parts of acrylic acid, 0.3 parts of 4-hydroxybutyl acrylate, and 0.2 parts of 2,2'-azobisisobutyronitrile were placed in this reaction vessel. After nitrogen purging, the temperature in the reaction vessel was increased to 55° C., and a polymerization reaction was conducted for 15 hours to obtain a solution of an acrylic copolymer having a weight average molecular weight of 810,000. The refractive index of the acrylic copolymer was 1.53.

To this solution, 60 parts of a copolymer of α-methylstyrene with styrene ("Kristalex 3085" available from Eastman Chemical Company, softening point: 82° C. to 88° C., weight average molecular weight: 1,200, refractive index: 1.61) and 7 parts of a styrene oligomer ("Piccolastic A5" available from Eastman Chemical Company, softening point: equal to or lower than room temperature, weight: average molecular weight: 430, refractive index: 1.60) as tackifiers (adhesiveness imparting agents); 0.6 parts of an isophorone diisocyanate adduct of trimethylol propane as a crosslinker; and 20 parts by weight of silicone particles ("XC-99" available from Momentive Performance Materials Inc., volume average particle diameter: 0.7 μm, specific gravity: 1.32) as first light-scattering particles were added relative to 100 parts of solid content of the aforementioned acrylic copolymer, thereby obtaining an adhesive composition C.

(2-2. Measurement of Refractive Index of Binder of First Light-Scattering Layer)

An adhesive composition C' containing no silicone particles was obtained by the same operation as in the above-described step (2-1) except that silicone particles were not added.

The adhesive composition Cr was applied onto a surface of a glass plate so that the thickness after crying was 10 μm, and dried at 80° C. for 5 minutes to form a test adhesive layer. The refractive index of the test adhesive layer was measured by an ellipsometer ("M-2000" manufactured by J. A. Woollam Japan) and was found to be 1.56.

(2-3. Production of Organic EL Light-Emitting Device)

An organic EL light-emitting device having a layer structure of (concavo-convex structure layer)/(substrate film layer)/(first light-scattering layer formed of adhesive composition C)/(glass substrate plate)/(second light-scattering layer)/(transparent electrode layer)/(hole transport layer)/(yellow light-emitting layer)/(blue light-emitting layer)/(electron transport layer)/(electron injection layer)/(reflecting electrode layer)/(sealing substrate plate) was obtained in the same manner as in Example 1 except that the adhesive composition C was used in place of the adhesive composition B in the above-described step (1-6).

Comparative Example 1

An organic EL light-emitting device having a layer structure of (substrate film layer)/(first light-scattering layer formed of adhesive composition B)/(glass substrate plate)/(second light-scattering layer)/(transparent electrode layer)/(hole transport layer)/(yellow light-emitting layer)/(blue light-emitting layer)/(electron transport layer)/(electron injection layer)/(reflecting electrode layer)/(sealing substrate plate) was obtained in the same manner as in Example 1 except that a step of forming a concavo-convex structure layer on a scattering adhesive sheet (i.e., the step (1-7) of Example 1) was not performed.

Comparative Example 2

An organic EL light-emitting device having a layer structure of (substrate film layer)/(first light-scattering layer formed of adhesive composition C)/(glass substrate plate)/(second light-scattering layer)/(transparent electrode layer)/(hole transport layer)/(yellow light-emitting layer)/(blue light-emitting layer)/(electron transport layer)/(electron injection layer)/(reflecting electrode layer)/(sealing substrate plate) was obtained in the same manner as in Example 2 except that a step of forming a concavo-convex structure layer on a scattering adhesive sheet was not performed.

[Evaluation]
[Calculation of Mean Free PELL of Scattering in Light-Scattering Layer]

In Examples and Comparative Examples described above, the mean free path $L_1$ of light scattering in the first light-scattering layer was calculated in accordance with the Mie scattering theory using a thickness of the first light-scattering layer of 35 μm, a refractive index of the binder of 1.56, an average particle diameter of the first light-scattering particles of 0.7 μm, and a concentration of the first light-scattering particles relative to the solid content of the first light-scattering layer of 6.9% by weight. It was found that was 14 μm.

Furthermore, in Examples and Comparative Examples described above, the mean free path L2 of light scattering in the second light-scattering layer was calculated using a thickness of the second light-scattering layer of 3 μm, a refractive index of the binder of 1.63, an average particle diameter of the second light-scattering particles of 0.5 μm, and a concentration of the second light-scattering particles relative to the solid content of the second light-scattering layer of 5.6% by weight. It was found that L2 was 9 μm.

Therefore, in Examples and Comparative Examples described above, D1/L1 in the first light-scattering layer was 2.5, and D2/L2 in the second light-scattering layer was 0.33.

[Measurement of Total Light Flux]

The total light flux of the organic EL light-emitting devices produced in Examples and Comparative Example described above were measured by a high-speed goniophotometric measurement system ("IMAGING SPHERE" manufactured by Radiant Imaging, Inc.). The measured total light flux was divided by the total light flux of the light-emitting element obtained in the step (1-3) of Example 1 to obtain a light extraction efficiency. The results are shown in the following Table 1.

TABLE 1 results of Examples 1, 2 and Comparative Examples 1, 2

|  | Example 1 | Example 2 | Comparative Example 1 | Comparative Example 2 |
| --- | --- | --- | --- | --- |
| D1/L1 | 2.5 | 2.5 | 2.5 | 2.5 |
| D2/L2 | 0.33 | 0.33 | 0.33 | 0.33 |
| Concavo-convex structure layer | Present | Present | Absent | Absent |
| Light extraction efficiency (times) | 1.2 | 1.2 | 1.12 | 1.12 |

As seen from the Table 1, high light extraction efficiency is obtained in Examples 1 and 2. It is confirmed that the present invention can achieve an organic EL light-emitting device that has a concavo-convex structure in a streak array pattern and is excellent in light extraction efficiency.

In the first light-scattering layer using a polymer having a high refractive index as a binder as shown in Example 2, expensive high refractive index nanoparticles such as zirconia oxide are not necessary. Further, a complex operation such as ball mill treatment for dispersion of high refractive index nanoparticles is not necessary. Therefore, is preferable that a binder containing a polymer having a high refractive index is used.

II. Examples on the Basis of Simulation

Example 3: Range of D1/L1

For a model of organic EL light-emitting device, the total light flux was calculated by an optical simulation using a program ("Light Tools" manufactured by ORA).

Settings for the organic EL light-emitting device modeled were configured so as to have a layer structure of (concavo-convex structure layer)/(substrate film layer)/(first light-scattering layer)/(glass substrate plate)/(second light-scattering layer)/(transparent electrode layer)/(light-emitting layer)/(reflecting electrode layer).

Settings for the concavo-convex structure layer were configured so as to have a concavo-convex structure in which prisms each having a cross section of isosceles triangle were uniformly disposed. As to the concavo-convex structure layer, the pitch of the prisms was set to 20 μm, the apex angle of the prisms was set to 60°, and the refractive index was set to 1.52.

Settings for the substrate film layer were configured so as to have a refractive index of 1.52 and a thickness of 100 μm.

Settings for the first light-scattering layer were configured so that the refractive index of the first light-scattering particles was 1.43, and the refractive index of the binder was 1.56.

Settings for the glass substrate plate were configured so as to have a refractive index of 1.52 and a thickness of 600 μm.

Settings for the second light-scattering layer were configured so that the average particle diameter of the second light-scattering particles was 0.5 μm, the refractive index of the second light-scattering particles was 1.43, the volume concentration of the second light-scattering particles was 1%, the refractive index of the binder was 1.75, and the thickness thereof was 5 μm. D2/L2 was 0.15.

Settings for the transparent electrode layer were configured so as to have a refractive index of 1.8 and a thickness of 0.15 μm.

Settings for the light-emitting layer were configured so as to have a refractive index of 1.8 and a thickness of 0.2 μm.

Settings for the reflecting electrode layer were configured so as to have a reflectance of 85%.

Further, on an interface between the transparent electrode layer and the second light-scattering layer, a virtual light-emitting surface of Lambertan distribution was set.

As to the organic EL light-emitting device modeled as described above, calculations for the total light flux were performed with variations of D1/L1 that were generated by varying the thickness of the first light-scattering layer and the concentration of the first light-scattering particles in the first light-scattering layer.

The calculations for the total light flux were performed for cases where the average particle diameters φ of the first light-scattering particles were set to 0.4 μm, 0.7 μm, 1.0 μm, and 2.0 μm, respectively. The results of calculated total light flux are shown as relative values in FIG. 6.

Figure 6:
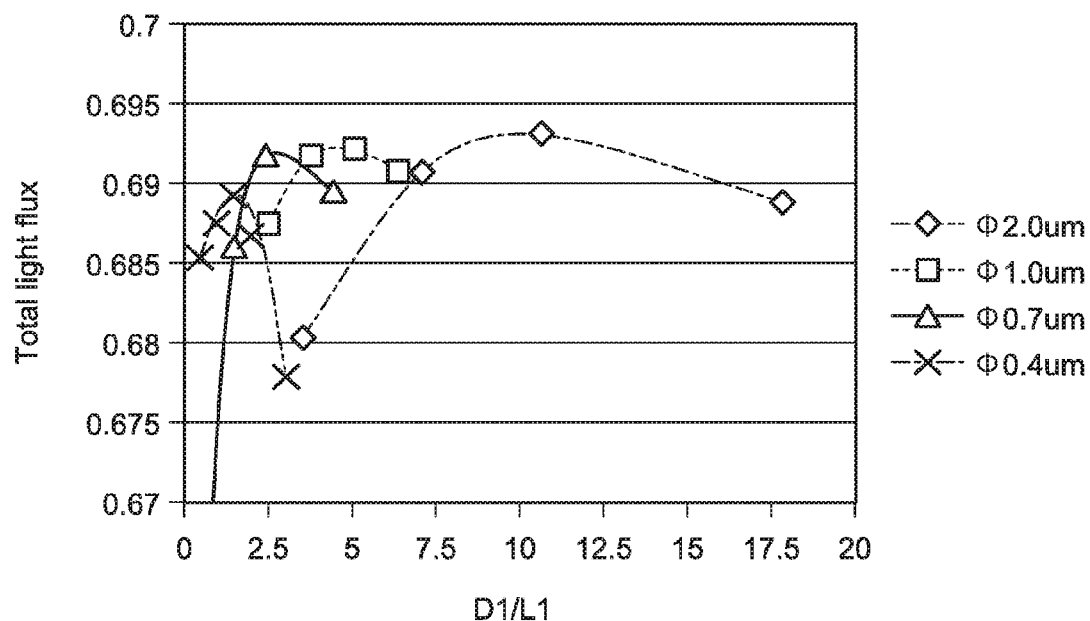
FIG. 6 is a graph showing a relationship between D1/L1 and the total light flux obtained by simulation according to Example 3 of the present invention.

From FIG. 6, it is confirmed that higher light extraction efficiency is obtained in a range of D1/L1<15 when the average particle diameter of the first light-scattering particles falls within a range of 0.4 μm to 2 μm. In particular, it is confirmed that the light extraction efficiency is maximized in a range of D1/L1<6 when the average particle diameter of the first light-scattering particles falls within a range of 0.4 μm to 1 μm.

Example 4: Range of (D1/L1+D2/L2)

For a model of organic EL light-emitting device, the total light flux was calculated by the optical simulation using the program ("Light Tools" manufactured by ORA).

Settings for the organic EL light-emitting device modeled were configured so as to have a layer structure of (concavo-convex structure layer)/(substrate film layer) (first light-scattering layer)/(glass substrate plate) (second light-scattering layer)/(transparent electrode layer)/(light-emitting layer)/(reflecting electrode layer).

Settings for the concavo-convex structure layer were configured so as to have a concavo-convex structure in which prisms each having a cross section of isosceles triangle were uniformly disposed. As to the concavo-convex structure layer, the pitch of the prisms was set to 20 μm, the apex angle of the prisms was set to 60°, and the refractive index was set to 1.52.

Settings for the substrate film layer were configured so as to have a refractive index of 1.52 and a thickness of 100 µm.

Settings for the first light-scattering layer were configured so that the average particle diameter of the first light-scattering particles was 0.7 µm, the refractive index of the first light-scattering particles was 1.43, and the refractive index of the binder was 1.56.

Settings for the glass substrate plate were configured so as to have a refractive index of 1.52 and a thickness of 600 µm.

Settings for the second light-scattering layer were configured so that the average particle diameter of the second light-scattering particles was 0.5 µm, the refractive index of the second light-scattering particles was 1.43, and the refractive index of the binder was 1.75.

Settings for the transparent electrode layer were configured so as to have a refractive index of 1.8 and a thickness of 0.15 µm.

Settings for the light-emitting layer were configured so as to have a refractive index of 1.8 and a thickness of 0.2 µm.

Settings for the reflecting electrode layer were configured so as to have a reflectance of 85%.

Further, on an interface between the transparent electrode layer and the second light-scattering layer, a virtual light-emitting surface of Lambertian distribution was set.

Figure 7:
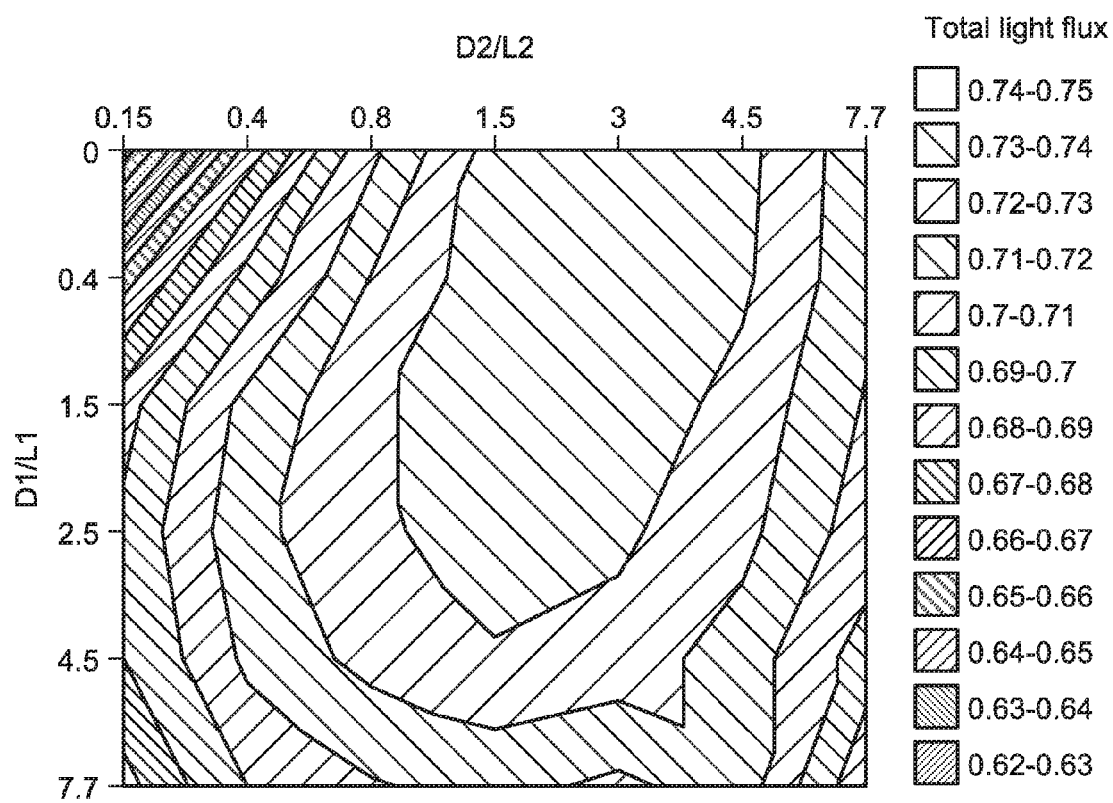
FIG. 7 is a diagram showing a relationship between D1/L1 and D2/L2 and the total light flux obtained by simulation according to Example 4 of the present invention.

As to the organic EL light-emitting device modeled as described above, calculations for the total light flux were performed. The calculations for the total light flux were performed with variations of D1/L1 and D2/L2 as shown in Table 2 that were generated by varying the thickness of the first light-scattering layer, the concentration of the first light-scattering particles in the first light-scattering layer, the thickness of the second light-scattering layer, and the concentration of the second light-scattering particles in the second light-scattering layer. The results of calculated total light flux are shown as relative values in Table 2 and FIG. 7.

TABLE 2

[total light flux calculated by simulation according to Example 3 (relative value)]

| | | D2/L2 | | | | | |
|---|---|---|---|---|---|---|---|
| | 0.15 | 0.4 | 0.8 | 1.5 | 3 | 4.5 | 7.7 |
| D1/L1 0 | 0.594 | 0.664 | 0.708 | 0.734 | 0.739 | 0.733 | 0.714 |
| 0.4 | 0.655 | 0.693 | 0.720 | 0.736 | 0.738 | 0.732 | 0.713 |
| 1.5 | 0.686 | 0.713 | 0.728 | 0.737 | 0.736 | 0.727 | 0.709 |
| 2.5 | 0.692 | 0.717 | 0.728 | 0.735 | 0.732 | 0.723 | 0.705 |
| 4.5 | 0.689 | 0.712 | 0.723 | 0.729 | 0.726 | 0.715 | 0.696 |
| 7.7 | 0.678 | 0.700 | 0.709 | 0.713 | 0.708 | 0.715 | 0.682 |

As seen from Table 2, when both the values of D1/L1 and D2/L2 are large, the total light flux starts to decrease. Accordingly, (D1/L1+D2/L2)<6 is appropriate.

Example 5: Apex Angle of Prism

For a model of an organic EL light-emitting device, the total light flux was calculated by the optical simulation using the program ("Light Tools" manufactured by ORA).

Settings for the organic Em light-emitting device modeled were configured so as to have a layer structure of (concavo-convex structure layer)/(substrate film layer)/(first light-scattering layer)/(glass substrate plate)/(second light-scattering layer)/(transparent electrode layer)/(light-emitting layer)/(reflecting electrode layer).

Settings for the concavo-convex structure layer were configured so as to have a concavo-convex structure in which prisms each having a cross section of isosceles triangle were uniformly disposed. As to the concavo-convex structure layer, the pitch of the prisms was set to 20 µm, and the refractive index was set to 1.52.

Settings for the substrate film layer were configured so as to have a refractive index of 1.52 and a thickness of 100 µm.

Settings for the first light-scattering layer were configured so that the average particle diameter of the first light-scattering particles was 0.7 µm, the refractive index of the first light-scattering particles was 1.43, the volume concentration of the first light-scattering particles was 8%, the refractive index of the binder was 1.56, and the thickness was 20 µm. D1/L1 was 1.5.

Settings for the glass substrate plate were configured so as to have a refractive index of 1.52 and a thickness of 600 µm.

Settings for the second light-scattering layer were configured so that the average particle diameter of the second light-scattering particles was 0.5 µm, the refractive index of the second light-scattering particles was 1.43, and the refractive index of the binder was 1.75.

Settings for the transparent electrode layer were configured so as to have a refractive index of 1.8 and a thickness of 0.15 µm.

Settings for the light-emitting layer were configured so as to have a refractive index of 1.8 and a thickness of 0.2 µm.

Settings for the reflecting electrode layer were configured so as to have a reflectance of 85%.

Further, on an interface between the transparent electrode layer and the second light-scattering layer, a virtual light-emitting surface of Lambertian distribution was set.

As to the organic EL light-emitting device modeled as described above, calculations for the total light flux were performed with variations of the apex angle of the prisms of the concavo-convex structure layer. The calculations for the total light flux were performed with each of variations in which D2/L2 was set to 0.4, 0.8, 1.5, and 3 by varying the thickness of the second light-scattering layer and the concentration of the second light-scattering particles in the second light-scattering layer. The results of calculated total light flux are shown as relative values in FIG. 8.

Figure 8:
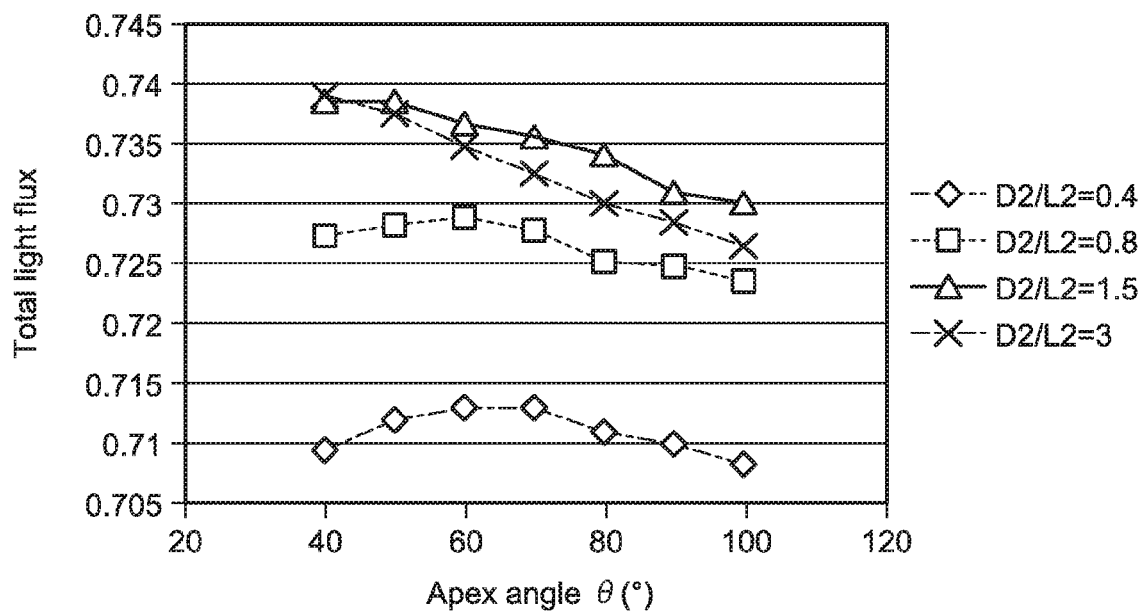
FIG. 8 is a graph showing a relationship between the apex angle of prisms and the total light flux obtained by simulation according to Example 5 of the present invention.

As seen from FIG. 8, in a case where D2/L2 is as small as about 0.4 to about 0.8, the total light flux is maximized when the apex angle of the prisms of the concavo-convex structure layer is about 60° to about 70°. FIG. 8 also shows that, in a case where D2/L2 is large, an acute apex angle of the prisms brings about enhancement of the total light flux. Therefore, when the apex angle of prisms of the concavo-convex structure layer is about 80° or smaller, the light extraction efficiency can be made particularly large.

Reference Example 1

Figure 9:
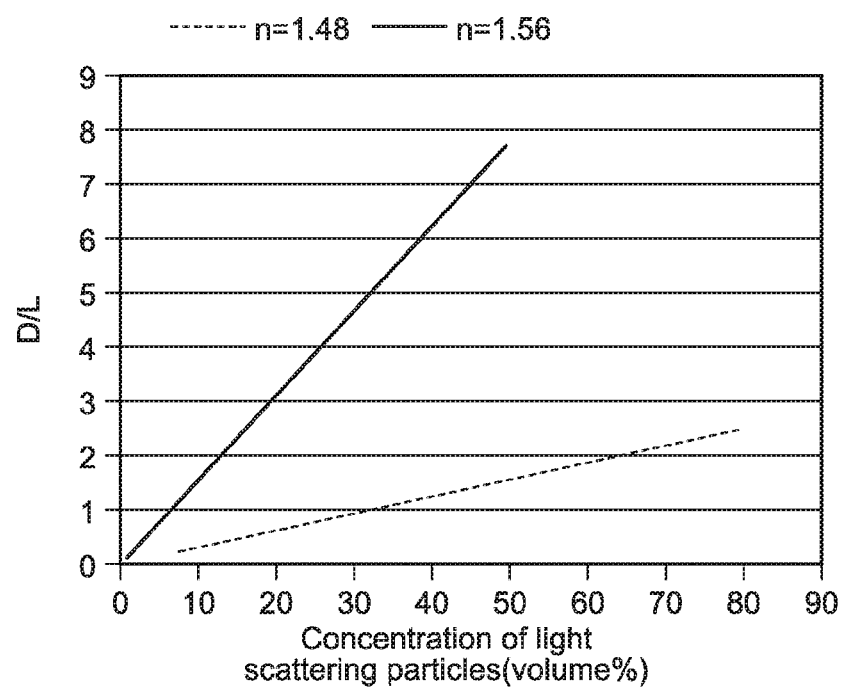
FIG. 9 is a graph showing a relationship between the concentration of light-scattering particles and D/L obtained in Reference Example 1.

FIG. 9 shows ratios D/L or a thickness D of a layer containing light-scattering particles and a binder relative to a mean free path L of light scattering in cases of using either one of binders having a refractive index of 1.48 or 1.56. In these cases, the thickness of the layer was 20 µm, the average particle diameter of light-scattering particles was 0.7 µm, and the refractive index of the light-scattering particles was 1.43. The specific gravity of the binder was 1, and the specific gravity of the light-scattering particles was 1.32.

As seen from FIG. 9, when a binder having a higher refractive index is used, a larger value of D/L can be obtained using a small amount of the light-scattering particles. Therefore, this shows that when a binder having higher refractive index is used, desired D/L is easily obtained and as a result, the light extraction efficiency is easily improved.

DESCRIPTION OF NUMERALS 100 organic EL light-emitting device
100U light-emitting surface
110 light-emitting surface structure layer
111 concavo-convex structure layer
112 substrate film layer
112D surface of substrate film layer
120 first light-scattering layer
130 substrate plate layer
130D surface of substrate plate layer
140 second light-scattering layer
150 light-emitting element layer
151 transparent electrode layer
152 light-emitting layer
153 reflecting electrode layer
160 sealing layer
170 concavo-convex structure
171 prism
200 organic EL light-emitting device
241 first light-transmitting layer
242 second light-transmitting layer
243 interface
243A-243C surface portions
300U light-emitting surface
311 concavo-convex structure layer
370 concavo-convex structure
371 prism

The invention claimed is:

1. An organic EL light-emitting device comprising: a light-emitting layer capable of generating light; a light-scattering structure capable of scattering the light; a first light-scattering layer containing first light-scattering particles having an average particle diameter of 0.1 μm to 2 μm and a first binder; and a concavo-convex structure in a streak array pattern, the light emitting layer, the light-scattering structure, the first light-scattering layer, and the concavo-convex structure being disposed in this order, wherein a mean free path L1 of light scattering in the first light-scattering layer and a thickness D1 of the first light-scattering layer satisfy D1/L1<15.

2. The organic EL light-emitting device according to claim 1, wherein
the average particle diameter of the first light-scattering particles is 0.4 μm to 1 μm, and
$D1/L1<6$.

3. The organic EL light-emitting device according to claim 1, wherein
the light-scattering structure is a second light-scattering layer containing second light-scattering particles, and
a mean free path L2 of light scattering in the second light-scattering layer and a thickness D2 of the second light-scattering layer satisfy (D1/L1+D2/L2)<6.

4. The organic EL light-emitting device according to claim 3, wherein a ratio of the second light-scattering particles in the second light-scattering layer is 0.5% by weight or more and 40% by weight or less.

5. The organic EL light-emitting device according to claim 3, wherein an average particle diameter of the second light-scattering particles is 0.2 μm or more and 2 μm or less.

6. The organic EL light-emitting device according to claim 1, wherein the concavo-convex structure includes a prism.

7. The organic EL light-emitting device according to claim 6, wherein the prism has an apex angle of 80° or smaller.

8. The organic EL light-emitting device according to claim 1, wherein the first binder has a refractive index of 1.5 or more.

9. The organic EL light-emitting device according to claim 1, wherein the first binder contains high refractive index nanoparticles.

10. The organic EL light-emitting device according to claim 9, wherein the high refractive index nanoparticles are contained in a ratio of 20% by weight or more and 80% by weight or less relative to a total amount of the first binder.

11. The organic EL light-emitting device according to claim 1, wherein the first light-scattering layer has adhesiveness.

* * * * *